(12) United States Patent
Fukagawa et al.

(10) Patent No.: US 11,832,470 B2
(45) Date of Patent: *Nov. 28, 2023

(54) ORGANIC ELECTROLUMINESCENCE DEVICE AND ELECTRONIC APPARATUS

(71) Applicant: SEIKO EPSON CORPORATION, Tokyo (JP)

(72) Inventors: Takefumi Fukagawa, Nagano-Ken (JP); Jun Irobe, Chino (JP); Tetsuya Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 17/141,178

(22) Filed: Jan. 4, 2021

(65) Prior Publication Data

US 2021/0210727 A1 Jul. 8, 2021

(30) Foreign Application Priority Data

Jan. 6, 2020 (JP) ................................ 2020-000475

(51) Int. Cl.
*H10K 50/844* (2023.01)
*H10K 50/852* (2023.01)
*H10K 50/858* (2023.01)
*H10K 59/12* (2023.01)
(Continued)

(52) U.S. Cl.
CPC ......... *H10K 50/844* (2023.02); *H10K 50/852* (2023.02); *H10K 50/858* (2023.02); *H10K 59/12* (2023.02); *H10K 59/38* (2023.02); *H10K 2102/351* (2023.02)

(58) Field of Classification Search
CPC ... H10K 50/844; H10K 50/858; H10K 50/852
See application file for complete search history.

(56) References Cited

U.S. PATENT DOCUMENTS

| | | | |
|---|---|---|---|
| 6,406,802 B1 | 6/2002 | Arai et al. | |
| 6,888,305 B2 | 5/2005 | Weaver | |
| 9,299,884 B2 | 3/2016 | Won et al. | |

(Continued)

FOREIGN PATENT DOCUMENTS

| | | |
|---|---|---|
| JP | 2011204377 | 10/2011 |
| JP | 2013235726 | 11/2013 |

(Continued)

*Primary Examiner* — Mariceli Santiago
(74) *Attorney, Agent, or Firm* — JCIPRNET

(57) ABSTRACT

An organic electroluminescence device includes an organic electroluminescence element, and a protective layer that protects the organic electroluminescence element, wherein the protective layer includes a first insulating film, a second insulating film, a third insulating film, a fourth insulating film, and a fifth insulating film, a density of the second insulating film is higher than a density of each of the first insulating film, the third insulating film, and the fifth insulating film, a density of the fourth insulating film is higher than the density of each of the first insulating film, the third insulating film, and the fifth insulating film, and each of the first insulating film, the second insulating film, the third insulating film, the fourth insulating film, and the fifth insulating film includes an inorganic material including silicon and nitrogen.

19 Claims, 12 Drawing Sheets

(51) Int. Cl.
   *H10K 59/38*   (2023.01)
   *H10K 102/00*  (2023.01)

(56) References Cited

U.S. PATENT DOCUMENTS

| | | | |
|---|---|---|---|
| 11,539,028 B2* | 12/2022 | Fukagawa | H10K 50/844 |
| 2003/0034497 A1 | 2/2003 | Yamazaki et al. | |
| 2003/0117066 A1 | 6/2003 | Silvernail | |
| 2009/0051275 A1 | 2/2009 | Kobayashi et al. | |
| 2011/0042702 A1 | 2/2011 | Lim et al. | |
| 2012/0187386 A1 | 7/2012 | Matsumi | |
| 2012/0242218 A1 | 9/2012 | Yoshinaga et al. | |
| 2013/0244079 A1 | 9/2013 | Mandlik et al. | |
| 2013/0334511 A1 | 12/2013 | Savas et al. | |
| 2014/0027735 A1 | 1/2014 | Kim et al. | |
| 2014/0295597 A1 | 10/2014 | Sato et al. | |
| 2014/0306213 A1 | 10/2014 | Sato et al. | |
| 2015/0118774 A1 | 4/2015 | Sato et al. | |
| 2015/0279912 A1 | 10/2015 | Negishi | |
| 2016/0020431 A1 | 1/2016 | Yamae et al. | |
| 2016/0276624 A1 | 9/2016 | Wang | |
| 2016/0319432 A1 | 11/2016 | Hasegawa | |
| 2017/0154947 A1 | 6/2017 | Nakamura | |
| 2017/0244066 A1 | 8/2017 | Kamiya et al. | |
| 2018/0053915 A1 | 2/2018 | Washio et al. | |
| 2018/0122871 A1 | 5/2018 | Choi | |
| 2018/0151843 A1 | 5/2018 | Ma et al. | |
| 2018/0174508 A1 | 6/2018 | Jeong et al. | |
| 2019/0211219 A1 | 7/2019 | Kondo et al. | |
| 2019/0237521 A1 | 8/2019 | Ju | |
| 2020/0004381 A1 | 1/2020 | Han et al. | |
| 2020/0006706 A1 | 1/2020 | Washio et al. | |
| 2021/0057674 A1* | 2/2021 | Huang | H10K 71/00 |

FOREIGN PATENT DOCUMENTS

| | | |
|---|---|---|
| JP | 2014191962 | 10/2014 |
| JP | 2015157370 | 9/2015 |
| JP | 2017147191 | 8/2017 |
| JP | 2018028996 | 2/2018 |
| JP | 2018147706 | 9/2018 |
| JP | 2018186028 | 11/2018 |
| JP | 2019135724 | 8/2019 |
| JP | 2019169301 | 10/2019 |

* cited by examiner

ORGANIC ELECTROLUMINESCENCE DEVICE AND ELECTRONIC APPARATUS

The present application is based on, and claims priority from JP Application Serial Number 2020-000475, filed Jan. 6, 2020, the disclosure of which is hereby incorporated by reference herein in its entirety.

BACKGROUND

1. Technical Field

The present disclosure relates to an organic electroluminescence device and an electronic apparatus.

2. Related Art

Organic electroluminescence (EL) devices including organic EL elements are known. The organic EL device is used as, for example, an organic EL display configured to display an image.

An organic EL device described in JP 2018-28996 A includes an organic EL element and a protective film covering the organic EL element. The protective film has a function to prevent moisture from entering the organic EL element. The protective film is a laminated film formed of three films. Specifically, the laminated film includes, for example, a first insulating film formed of a silicon nitride film, a second insulating film formed of an aluminum oxide film, and a third insulating film formed of a silicon nitride film. Each of the first insulating film and the third insulating film is formed by a CVD method (chemical vapor deposition method). The second insulating film is formed by an ALD method (atomic layer deposition method). Furthermore, the second insulating film is formed to fill a pin hole formed in the first insulating film.

In JP 2018-28996 A, the second insulating film is formed of a material different from that of each of the first insulating film and the third insulating film. Thus, when light is transmitted through the protective film, an effect of interfacial reflection due to a refractive index difference between respective films included in the protective film is large, thus there is a possibility that an effect on optical characteristics of the organic EL device may occur. In addition, it is conceivable to reduce the number of insulating films included in the protective film in order to suppress this effect. However, when a total number of the insulating films is decreased, sealing performance of the protective film may be compromised.

SUMMARY

An aspect of an organic electroluminescence device of the present disclosure includes an organic electroluminescence element, and a protective layer that is configured to protect the organic electroluminescence element and has optical transparency, wherein the protective layer includes a first insulating film, a second insulating film, a third insulating film, a fourth insulating film, and a fifth insulating film, the first insulating film, the second insulating film, the third insulating film, the fourth insulating film, and the fifth insulating film are arranged in this order in a direction away from the organic electroluminescence element, density of the second insulating film is higher than density of each of the first insulating film, the third insulating film, and the fifth insulating film, density of the fourth insulating film is higher than density of each of the first insulating film, the third insulating film, and the fifth insulating film, and each of the first insulating film, the second insulating film, the third insulating film, the fourth insulating film, and the fifth insulating film is formed of an inorganic material including silicon and nitrogen.

An aspect of an organic electroluminescence device of the present disclosure includes an organic electroluminescence element, and a protective layer that is configured to protect the organic electroluminescence element and has optical transparency, wherein the protective layer includes a first insulating film, a second insulating film, a third insulating film, a fourth insulating film, and a fifth insulating film, the first insulating film, the second insulating film, the third insulating film, the fourth insulating film, and the fifth insulating film are arranged in this order in a direction away from the organic electroluminescence element, density of the second insulating film is higher than density of each of the first insulating film, the third insulating film, and the fifth insulating film, density of the fourth insulating film is higher than density of each of the first insulating film, the third insulating film, and the fifth insulating film, and of the first insulating film, the second insulating film, the third insulating film, the fourth insulating film, and the fifth insulating film, a difference in refractive index in visible light regions between any two insulating films is within 0.2.

An aspect of an electronic apparatus of the present disclosure includes the above-described organic electroluminescence device, and a control unit configured to control operation of the organic electroluminescence device.

An aspect of a method for manufacturing an organic electroluminescence device of the present disclosure includes a step for forming an organic electroluminescence element at a substrate, a step for forming a first insulating film at the organic electroluminescence element by a chemical vapor deposition method using plasma, a step for forming a second insulating film at the first insulating film by an atomic layer deposition method using plasma, a step for forming a third insulating film at the second insulating film by a chemical vapor deposition method using plasma, a step for forming a fourth insulating film at the third insulating film by an atomic layer deposition method using plasma, and a step for forming a fifth insulating film at the fourth insulating film by a chemical vapor deposition using plasma, wherein each of the first insulating film, the second insulating film, the third insulating film, the fourth insulating film, and the fifth insulating film is formed of an inorganic material including silicon and nitrogen.

An aspect of a method for manufacturing an organic electroluminescence device of the present disclosure includes a step for forming an organic electroluminescence element at a substrate, a step for forming a first insulating film at the organic electroluminescence element by a chemical vapor deposition method using plasma, a step for forming a second insulating film at the first insulating film by an atomic layer deposition method using plasma, a step for forming a third insulating film at the second insulating film by a chemical vapor deposition method using plasma, a step for forming a fourth insulating film at the third insulating film by an atomic layer deposition method using plasma, and a step for forming a fifth insulating film at the fourth insulating film by a chemical vapor deposition using plasma, wherein a difference in refractive index between respective visible light regions of any two number of the insulating films of the first insulating film, the second insulating film, the third insulating film, the fourth insulating film, and the fifth insulating film is within 0.2.

DESCRIPTION OF EXEMPLARY EMBODIMENTS

Figure 1:
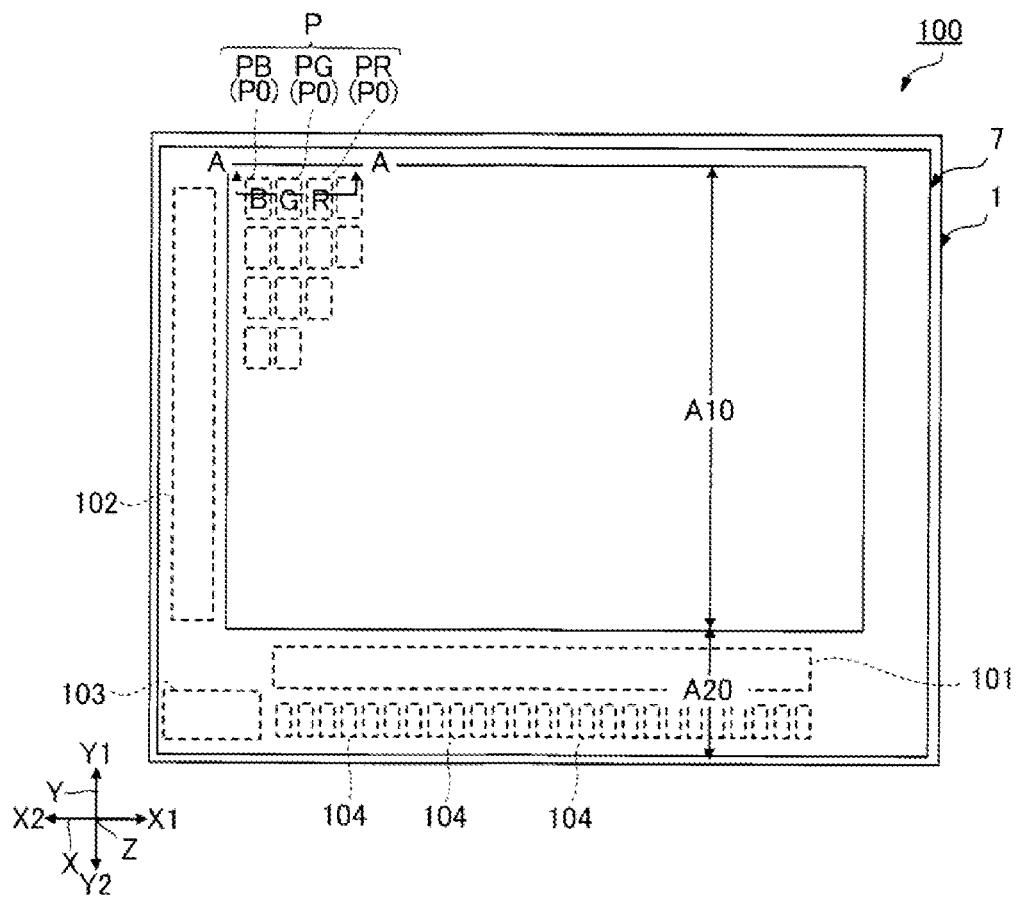
FIG. 1 is a plan view illustrating an organic EL device according to a first exemplary embodiment.

Preferred exemplary embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions. Also, "an element A is equal to an element B" as described herein means that the element A and the element B are substantially equal to each other, and the meaning includes manufacturing errors.

1. Organic EL Device

1A. First Exemplary Embodiment 1A-1. Configuration of Organic EL Device

FIG. 1 is a plan view illustrating an organic EL (electroluminescence) device 100 according to a first exemplary embodiment. Note that, for convenience of explanation, the description will be made appropriately using an X-axis, a Y-axis, and a Z-axis orthogonal to each other. In addition, a direction along the X-axis is referred to as an X1 direction, and a direction opposed to the X1 direction is referred to as an X2 direction. In addition, a direction along the Y-axis is referred to as a Y1 direction, and a direction opposed to the Y1 direction is referred to as a Y2 direction. A direction along the Z-axis is referred to as a Z1 direction, and a direction opposed to the Z1 direction is referred to as a Z2 direction. Furthermore, viewing in the Z1 direction or the Z2 direction is referred to as "in plan view". Further, "optical transparency" refers to transparency to visible light, and means that transmittance of visible light may be greater than or equal to 50%. Further, "light reflectivity" refers to reflectivity to visible light, and means that a reflectance of visible light may be greater than or equal to 50%.

The organic EL device 100 illustrated in FIG. 1 is a display device configured to display a full color image. Note that, images include one that displays only character information. The organic EL device 100 is suitably used as a micro display configured to display an image in a head-mounted display, for example.

Further, the organic EL device 100 includes a display area A10 in which an image is displayed, and a peripheral area A20 surrounding the display area A10 in plan view. Note that, a shape of the display area A10 in plan view is approximately quadrangular, but may have other shapes.

The display area A10 is constituted by a plurality of pixels P. Each pixel P is a smallest unit in display of an image. The plurality of pixels P are arranged in a matrix along the X-axis and the Y-axis, for example. Each pixel P has a sub-pixel PB from which light in a blue wavelength region is obtained, a sub-pixel PG from which light in a green wavelength region is obtained, and a sub-pixel PR from which light in a red wavelength region is obtained. Note that, a shape of each of the sub-pixels PB, PG, and PR in plan view is approximately quadrangular, but may have other shapes. Furthermore, an array of the sub-pixels PB, PG, and PR is not particularly limited. Examples of the array include a stripe array, a rectangle array, a Bayer array, or a delta array.

Hereinafter, when the sub-pixel PB, the sub-pixel PG, and the sub-pixel PR are not differentiated, notation of a sub-pixels P0 is used. The sub-pixel P0 is an element that constitutes the pixel P. The sub-pixel P0 is an example of a unit circuit that is a smallest unit of an image to be displayed. The sub-pixel PB, the sub-pixel PG, and the sub-pixel PR represent one number of the pixel P of a color image. One sub-pixel P0 is controlled independently from another sub-pixels P0. Further, any one of the blue wavelength region, the green wavelength region, and the red wavelength region is a "first wavelength region", another one is a "second wavelength region" and a remaining one is a "third wavelength region". Hereinafter, a case where the blue wavelength region is referred to as the "first wavelength region", the red wavelength region is referred to as the "second wavelength region", and the red wavelength region is referred to as the "third wavelength region" is used as an example for description. Thus, in the present exemplary embodiment, the sub-pixel PB is referred to as a "first pixel", the sub-pixel PG is referred to as a "second pixel", and the sub-pixel PR is referred to as a "third pixel".

As illustrated in FIG. 1, the organic EL device 100 includes an element substrate 1 and a transmissive substrate 7 having optical transparency. The organic EL device 100 has so-called top emission structure. The organic EL device 100 emits light from the transmissive substrate 7.

The element substrate 1 includes a data line driving circuit 101, a scanning line drive circuit 102, a control circuit 103, and a plurality of external terminals 104. The data line driving circuit 101, the scanning line drive circuit 102, the control circuit 103, and the plurality of external terminals 104 are disposed in the peripheral area A20. The data line driving circuit 101 and the scanning line drive circuit 102 are peripheral circuits that control driving of each part constituting the plurality of sub-pixels P0. The control circuit 103 controls display of an image. Image data is supplied to the control circuit 103 from an upper circuit (not illustrated). The control circuit 103 supplies various signals based on the image data to the data line driving circuit 101 and the scanning line drive circuit 102. Although not illustrated, a flexible printed circuit (FPC) board or the like is coupled to the external terminal 104 for electrical coupling with the upper circuit. Further, a power supply circuit (not illustrated) is electrically coupled to the element substrate 1.

In addition, an area of the transmissive substrate 7 in plan view is smaller than an area of the element substrate 1 in plan view, and the transmissive substrate 7 is disposed such that the external terminal 104 is exposed.

Figure 2:
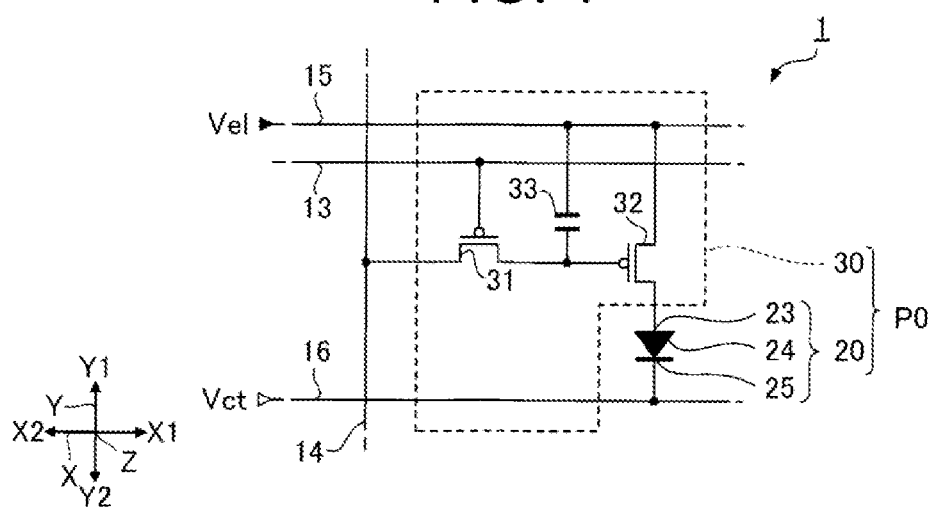
FIG. 2 is an equivalent circuit diagram of a sub-pixel illustrated in FIG. 1.

FIG. 2 is an equivalent circuit diagram of the sub-pixel P0 illustrated in FIG. 1. A plurality of scanning lines 13 and a plurality of data lines 14 are provided on the element substrate 1. In FIG. 2, one number of the scanning line 13 and one number of the data line 14 corresponding to one number of the sub-pixel P0 are illustrated. The scanning line 13 extends along the X-axis, and the data line 14 extends along the Y-axis. Note that, although not illustrated, the plurality of scanning lines 13 and the plurality of data lines 14 are arranged in a lattice. The scanning line 13 is coupled to the scanning line drive circuit 102 illustrated in FIG. 1, and the data line 14 is coupled to the data line driving circuit 101 illustrated in FIG. 1.

As illustrated in FIG. 2, the sub-pixel P0 includes an organic EL element 20 and a pixel circuit 30 that controls driving of the organic EL element 20. The organic EL element 20 includes an OLED (organic light emitting diode). The organic EL element 20 includes a pixel electrode 23, a common electrode 25, and a function layer 24 disposed therebetween. The pixel electrode 23 functions as an anode. The common electrode 25 functions as a cathode. In the organic EL element 20, holes supplied from the pixel electrode 23 and electrons supplied from the common electrode 25 are recombined in the function layer 24, and the function layer 24 emits light. Note that, a power supplying line 16 is electrically coupled to the common electrode 25. A power supply potential Vct on a low potential side is supplied from the power supply circuit (not illustrated) to the power supplying line 16. The pixel electrode 23 is provided for each sub-pixel P0. One pixel electrode 23 can be configured to be independent and mutually different from another pixel electrodes 23. More specifically, the pixel electrodes 23 may be set to flow different currents, or different voltages may be set to the pixel electrodes 23.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supplying line 15, and the other is electrically coupled to the pixel electrode 23. Note that a power supply potential Vel on a high potential side is supplied from the power supply circuit (not illustrated) to the power supplying line 15. Further, one of electrodes of the retention capacitor 33 is coupled to the gate of the driving transistor 32, and the other electrode is coupled to the power supplying line 15.

When the scanning line 13 is selected by activating a scanning signal by the scanning line drive circuit 102, the switching transistor 31 provided in the sub-pixel P0 selected is turned on. Then, data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the organic EL element 20. Then, the organic EL element 20 emits light at a luminance corresponding to a magnitude of the current supplied from the driving transistor 32. Further, when the scanning line drive circuit 102 releases the selection of the scanning line 13 and the switching transistor 31 is turned off, the potential of the gate of the driving transistor 32 is held by the retention capacitor 33. Thus, the organic EL element 20 can emit light even after the switching transistor 31 is turned off.

Note that the configuration of the pixel circuit 30 described above is not limited to the illustrated configuration. For example, the pixel circuit 30 may further include a transistor that controls conduction between the pixel electrode 23 and the driving transistor 32.

Figure 3:
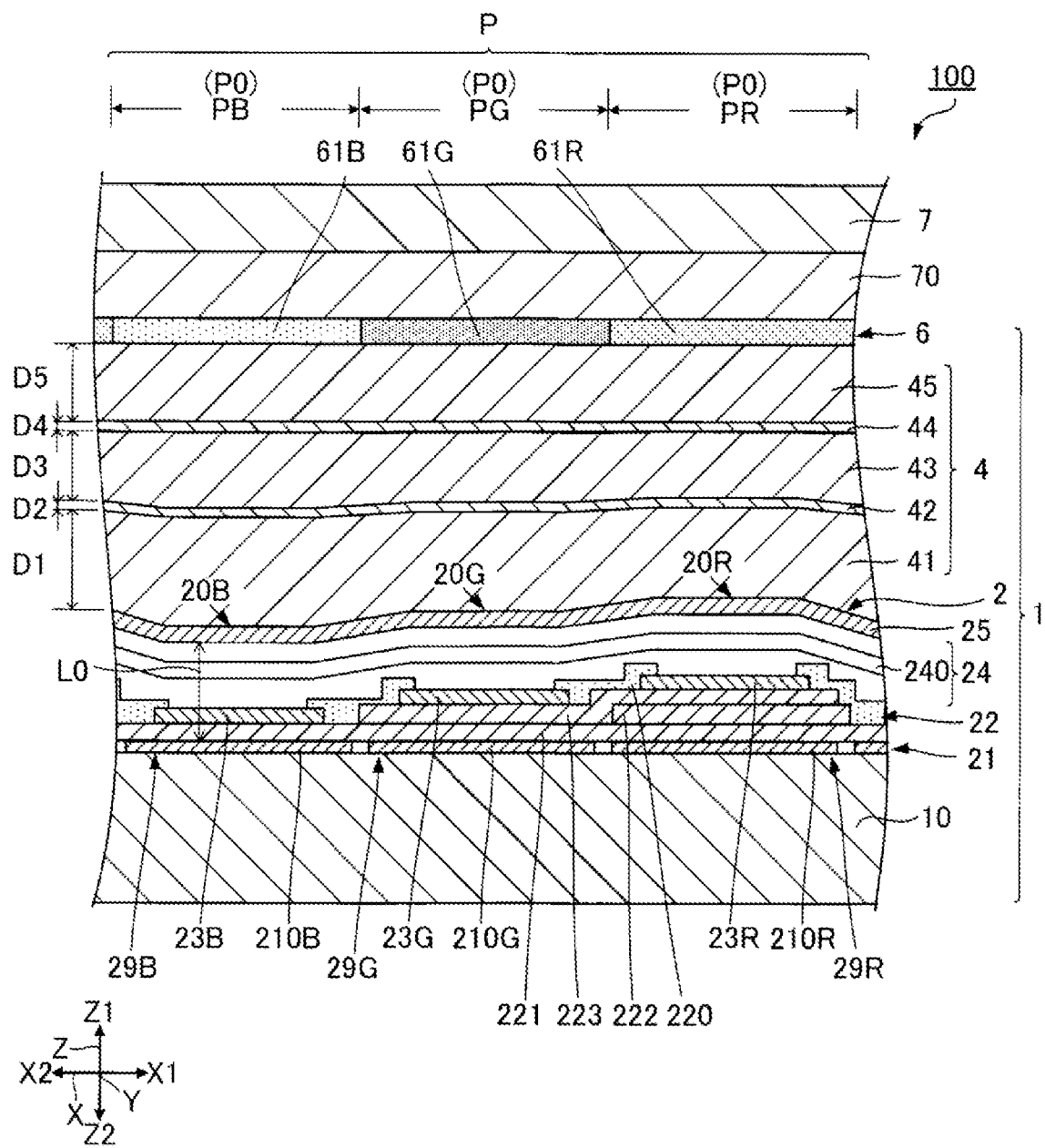
FIG. 3 is a view illustrating a cross section taken along a line A-A illustrated in FIG. 1.

FIG. 3 is a diagram illustrating a cross section taken along the line A-A in FIG. 1. In the following description, the Z1 direction is described as being an upward direction and the Z2 direction as a downward direction. Note that, in FIG. 3, arbitrary one number of the pixel P of the plurality of pixels P is illustrated.

As illustrated in FIG. 3, the organic EL device 100 includes the element substrate 1 and the transmissive substrate 7 that adheres to the element substrate 1 by an adhesive layer 70. The element substrate 1 includes a substrate 10, a light-emitting portion 2, a protective layer 4, and a color filter 6. The light-emitting portion 2 includes a reflection layer 21, an insulating layer 22, and a plurality of the organic EL elements 20. Further, the light-emitting portion 2 has a plurality of optical resonators 29. Additionally, the color filter 6 has a plurality of colored portions 61. In addition, the substrate 10, the reflection layer 21, the insulating layer 22, the plurality of organic EL elements 20, the protective layer 4, the color filter 6, and the transmissive substrate 7 are arranged in this order in the Z1 direction.

One reflection section 210, one number of the organic EL element 20, and one number of the colored portion 61 are present in each sub-pixel P0. In the following, for the reflection section 210, the organic EL element 20, and the colored portion 61, "B" is assigned to an end of a reference numeral of an element associated with the sub-pixel PB, "G" is assigned to an end of a reference numeral of an element associated with the sub-pixel PG, and "R" is assigned to an end of a reference numeral of an element associated with the sub-pixel PR. Note that, when respective light emission colors are not distinguished, "B", "G", or "R" at the end of the reference numeral is omitted.

The substrate 10 is, for example, a wiring substrate obtained by forming the pixel circuit 30 described above at a base material formed of silicon. Note that, the base material may be, for example, formed of glass, resin, or ceramic. Further, the organic EL device 100 is of a top-emission type, and thus the base material may or may not have optical transparency. Further, the switching transistor 31 and the driving transistor 32 included in the pixel circuit 30 may each be an MOS type transistor having an active layer, and for example, the active layer may be constituted of a silicon substrate. Note that, each of the switching transistor 31 and the driving transistor 32 described above may be a thin film transistor, or may be a field effect transistor. Further, examples of a material for each part and each wiring line constituting the pixel circuit 30 include conductive materials such as polysilicon, metal, metal silicide, and a metallic compound.

The reflection layer 21 includes a plurality of the reflection sections 210 having light reflectivity. Each reflection section 210 reflects light generated in the function layer 24. Note that, although not illustrated, the plurality of reflection sections 210 are arranged in a matrix corresponding to the plurality of sub-pixels P0 in plan view. The plurality of reflection sections 210 are disposed corresponding to a plurality of the pixel electrodes 23 in a one-to-one manner. Also, although not illustrated, each of the reflection sections 210 overlaps with the pixel electrode 23 corresponding thereto in plan view. Examples of a material of the reflection layer 21 include, for example, metal such as Al (aluminum) and Ag (silver), or alloys of the metal. Note that, the reflection layer 21 may function as a wiring line that is electrically coupled to the pixel circuit 30.

The insulating layer 22 is formed of a plurality of films having insulating properties. Specifically, the insulating layer 22 includes a first film 221, a second film 222, and a third film 223. The first film 221 covers the reflection layer 21. The first film 221 is formed in common with the pixel electrodes 23G, 23B and 23R. The second film 222 is disposed on the first film 221. The second film 222 overlaps with the pixel electrode 23R in plan view, and does not overlap with the pixel electrodes 23B and 23G in plan view. The third film 223 is disposed on a part of the first film 221 and the second film 222. The third film 223 overlaps with the pixel electrodes 23R and 23G in plan view, and does not overlap with the pixel electrode 23B in plan view. Further, an insulating film 220 having an opening is disposed on the insulating layer 22. The insulating film 220 covers an outer edge of each of the pixel electrodes 23B, 23G, and 23R.

The insulating layer 22 adjusts an optical distance L0 being an optical distance between the reflection section 210 and the common electrode 25 described later. The optical distance L0 varies for each light emission color. The optical distance L0 in the sub-pixel PB is set so as to correspond to light in the blue wavelength region. The optical distance L0 in the sub-pixel PG is set so as to correspond to light in the green wavelength region. The optical distance L0 in the sub-pixel PR is set so as to correspond to light in the red wavelength region. In the present exemplary embodiment, since a thickness of the insulating layer 22 varies depending on the sub-pixels PB, PG, and PR, the optical distance L0 varies for each light emission color.

Examples of a material of each film constituting the insulating layer 22 include, for example, silicon-based inorganic materials such as silicon oxide and silicon nitride. Note that, the configuration of the insulating layer 22 is not limited to the configuration illustrated in FIG. 3. In FIG. 3, the third film 223 is disposed on the second film 222, but for example, the second film 222 may be disposed on the third film 223.

The plurality of organic EL elements 20 are disposed on the insulating layer 22. Specifically, the plurality of pixel electrodes 23 are disposed on the insulating layer 22, the function layer 24 is disposed on the plurality of pixel electrodes 23, and the common electrode 25 is disposed on the function layer 24. The plurality of pixel electrodes 23 are disposed corresponding to the plurality of sub-pixels P0 in a one-to-one manner. Each of the function layer 24 and the common electrode 25 is provided in common with the plurality of sub-pixels P0. Accordingly, each of the function layer 24 and the common electrode 25 is common to the plurality of organic EL elements 20. In addition, in the present exemplary embodiment, an organic EL element 20B present in the sub-pixel PB corresponds to a "first organic electroluminescence element", an organic EL element 20G present in the sub-pixel PG corresponds to a "second organic electroluminescence element", and an organic EL element 20R present in the sub-pixel PR corresponds to a "third organic electroluminescence element".

The pixel electrode 23 has optical transparency. Examples of a material of the pixel electrode 23 include transparent conductive materials such as Indium Tin Oxide (ITO) and Indium Zinc Oxide (IZO). The plurality of pixel electrodes 23 are electrically isolated from each other by the insulating film 220. Further, the pixel electrode 23B is disposed on the first film 221, and each of the pixel electrode 23G and the pixel electrode 23R is disposed on the third film 223.

The function layer 24 includes a light emitting layer 240 that includes an organic luminescent material. The organic luminescent material is a luminescent organic compound. Further, in addition to the light emitting layer 240, the function layer 24 includes, for example, a hole injecting layer, a hole transport layer, an electron transport layer, an electron injecting layer, and the like. The function layer 24 includes the light emitting layer 240 from which the light emission colors of blue, green, and red are obtained, to achieve white light emission. Note that, the configuration of the function layer 24 is not particularly limited to the above-described configuration, and a known configuration can be applied.

The common electrode 25 is disposed on the function layer 24. Thus, the above-described function layer 24 is disposed between the plurality of pixel electrodes 23 and the common electrode 25. The common electrode 25 has light reflectivity and optical transparency. The common electrode 25 is formed of, for example, an alloy including Ag such as MgAg.

The common electrode 25 resonates light generated in the light emitting layer 240 between the common electrode 25 and the reflection layer 21. By providing the common electrode 25 and the reflection layer 21, light resonance structure is configured in which light of a desired resonant wavelength can be extracted for each of the sub-pixels PB, PG, and PR. Specifically, the light-emitting portion 2 includes an optical resonator 29B present in the sub-pixel PB, an optical resonator 29G present in the sub-pixel PG, and an optical resonator 29R present in the sub-pixel PR. Note that, when the optical resonators 29B, 29G, and 29R are not distinguished, notation of an optical resonator 29 is used. In the present exemplary embodiment, each of the optical resonators 29 includes the reflection section 210, the insulating layer 22, and the organic EL element 20. Each of the insulating layer 22 and the common electrode 25 is in common with the plurality of optical resonators 29. Also in the present exemplary embodiment, the optical resonator 29B corresponds to a "first optical resonator", the optical resonator 29G corresponds to a "second optical resonator", and the optical resonator 29R corresponds to a "third optical resonator".

The optical resonator 29B includes the organic EL element 20B, to enhance intensity of light in the blue wavelength region. The optical resonator 29G includes the organic EL element 20G, to enhance intensity of light in the green wavelength region. The optical resonator 29R includes the organic EL element 20R, to increase intensity of light in the red wavelength region. Thus, in the optical resonators 29B, 29G, and 29R, emission with an enhanced luminance at a resonant wavelength corresponding to each light emission color is obtained. The resonant wavelength is determined by the above-described optical distance L0. When a peak wavelength of a spectrum of light in a predetermined wavelength region is represented by λ0, the following relationship [1] holds true. Φ (radians) represents a sum of phase shifts that occur during transmission and reflection between the reflection section 210 and the common electrode 25.

$$\{(2 \times L0)/\lambda 0 + \Phi\}/(2\pi) = m0 \text{ (}m0 \text{ is an integer)} \quad [1]$$

The optical distance L0 is set such that a peak wavelength of light in a wavelength region to be extracted is λ0. Light in a predetermined wavelength region is enhanced by adjusting the optical distance L0 in accordance with the light in the wavelength region to be extracted, and the light can be increased in intensity and a spectrum of the light can be narrowed. Thus, by providing the optical resonator 29, light can be increased in intensity, and a spectrum of the light can be narrowed.

Note that, in the present exemplary embodiment, as described above, the optical distance L0 is adjusted by varying the thickness of the insulating layer 22 for each of the sub-pixels PB, PG, and PR. However, for example, the optical distance L0 may be adjusted by varying the thickness of the pixel electrode 23 for each of the sub-pixels PB, PG, and PR.

The protective layer 4 illustrated in FIG. 3 protects the plurality of organic EL elements 20. Specifically, the protective layer 4 seals the plurality of organic EL elements 20 to protect the plurality of organic EL elements 20 from an outside. For example, the protective layer 4 protects each organic EL element 20 from external moisture, oxygen, or the like. In other words, the protective layer 4 has gas barrier properties. Thus, the presence of the protective layer 4 makes it possible to suppress deterioration of the organic EL element 20, compared to a case where the protective layer 4 is not present. Thus, quality reliability of the organic EL device 100 can be increased. In addition, since the organic EL device 100 is of the top-emission type, the protective layer 4 has optical transparency.

The protective layer 4 includes a first insulating film 41, a second insulating film 42, a third insulating film 43, a fourth insulating film 44, and a fifth insulating film 45. The first insulating film 41, the second insulating film 42, the third insulating film 43, the fourth insulating film 44, and the fifth insulating film 45 are stacked in this order in a direction away from the light-emitting portion 2.

The first insulating film 41, the third insulating film 43, and the fifth insulating film 45 mitigate unevenness of an upper surface of the light-emitting portion 2. Accordingly, an upper surface of the protective layer 4 is flattened. Furthermore, each of the first insulating film 41, the third insulating film 43, and the fifth insulating film 45 is, for example, formed by a CVD method using plasma. The first insulating film 41 having a sufficiently thin thickness can be easily formed by being formed by the CVD method. Note that, the same applies to the third insulating film 43 and the fifth insulating film 45. Further, a film can be formed at a lower temperature by using plasma as compared to a case in which the plasma is not used, and stress of each of the first insulating film 41, the third insulating film 43, and the fifth insulating film 45 can be reduced by adjusting an amount of gas. Accordingly, a possibility that cracking or the like occurs in the protective layer 4 can be suppressed.

The second insulating film 42 and the fourth insulating film 44 complement defects that may occur in the first insulating film 41, the third insulating film 43, and the fifth insulating film 45, and prevents progress of the defect. In the first insulating film 41, the third insulating film 43, and the fifth insulating film 45, there is a possibility that defects such as pin holes or cracks, for example, may occur, due to unevenness of a front surface of the light-emitting portion 2 or presence of foreign matter. Thus, the presence of the second insulating film 42 and the fourth insulating film 44 suppresses, even when defects occur in the first insulating film 41, the third insulating film 43, and the fifth insulating film 45, transmission of moisture or the like in an atmosphere to the function layer 24 with the defects being a path.

Each of the second insulating film 42 and the fourth insulating film 44 is formed, for example, by an ALD method using plasma. By being formed by the ALD method, a high density film is easily formed. Thus, by using the ALD method, density of each of the second insulating film 42 and the fourth insulating film 44 can be increased. Thus, the function of preventing the progress of the defects by the second insulating film 42 and the fourth insulating film 44 can be effectively exhibited. Further, a film can be formed at a lower temperature by using plasma as compared to a case where the plasma is not used. Thus, stress of each of the second insulating film 42 and the fourth insulating film 44 can be reduced. As a result, a possibility that cracking or the like occurs in the protective layer 4 can be suppressed.

As illustrated in FIG. 3, a thickness D2 of the second insulating film 42 is smaller than each of a thickness D1 of the first insulating film 41, a thickness D3 of the third insulating film 43, and a thickness D5 of the fifth insulating film 45. Similarly, a thickness D4 of the fourth insulating film 44 is smaller than each of the thickness D1 of the first insulating film 41, the thickness D3 of the third insulating film 43, and the thickness D5 of the fifth insulating film 45. Accordingly, the function of each of the insulating films included in the protective layer 4 is effectively exhibited. Thus, the unevenness of the upper surface of the light-emitting portion 2 can be sufficiently mitigated, and even when a defect occurs in the protective layer 4, moisture can be sufficiently prevented from being transmitted to the function layer 24 with the defect being a path.

Further, the protective layer 4 has the five insulating films. The first insulating film 41, the second insulating film 42, the third insulating film 43, the fourth insulating film 44, and the fifth insulating film 45 are arranged in this order in a direction away from the plurality of organic EL elements 20. In addition, the density of the second insulating film 42 is greater than density of each of the first insulating film 41, the third insulating film 43, and the fifth insulating film 45. Similarly, the density of the fourth insulating film 44 is greater than the density of each of the first insulating film 41, the third insulating film 43, and the fifth insulating film 45. In other words, each of the second insulating film 42 and the fourth insulating film 44 is a high density film, and each of the first insulating film 41, the third insulating film 43, and the fifth insulating film 45 is a low density film.

The protective layer 4 further includes the fourth insulating film 44 and the fifth insulating film 45 in addition to the first insulating film 41, the second insulating film 42, and the third insulating film 43, thus sealing performance of the protective layer 4 can be enhanced. Specifically, the protective layer 4 has the low density film, thus the unevenness of the upper surface of the light-emitting portion 2 can be effectively mitigated. Furthermore, the protecting layer 4 has the high density film, thus progress of a defect in the protective layer 4 can be suppressed.

Additionally, the protective layer 4 has two sets of the low density film and the high density film, the sealing performance of the protective layer 4 can be enhanced, compared to a case where the protective layer 4 has one number of the set. The presence of a plurality of the sets reduces, even when a defect exists in each of the insulating films, overlap of the defects present in the respective insulating films in plan view. Accordingly, a possibility that defects occurring in the respective insulating films are connected and moisture is transmitted to the function layer 24 is suppressed. That is, the presence of the plurality of sets can effectively exhibit a labyrinth effect in the protective layer 4. As a result, a possibility of the deterioration of the organic EL element 20 can be reduced, and thus the organic EL device 100 having excellent quality reliability over a long period of time can be provided. Additionally, since the two sets of the low density film and the high density film are included, a variation in sealing performance in a plurality of the organic EL devices 100 can be reduced, compared to the case where one number of the set is included. Accordingly, a yield can be improved.

Furthermore, each of the first insulating film 41, the second insulating film 42, the third insulating film 43, the fourth insulating film 44, and the fifth insulating film 45 is formed of an inorganic material including silicon and nitrogen. Accordingly, a difference in refractive index between the insulating films can be reduced. Since the organic EL device 100 is of the top-emission type, by reducing the difference in refractive index, it is possible to suppress interfacial reflection between the insulating films. For this reason, extraction efficiency of light can be increased. Accordingly, deterioration in optical characteristics of the organic EL device 100 can be suppressed. Furthermore, when the organic EL device 100 is applied as a micro display, visual field angle characteristics can be improved. Thus, according to the protective layer 4, excellent sealing performance is obtained, and it is possible to suppress the deterioration in the optical characteristics of the organic EL device 100.

Figure 4:
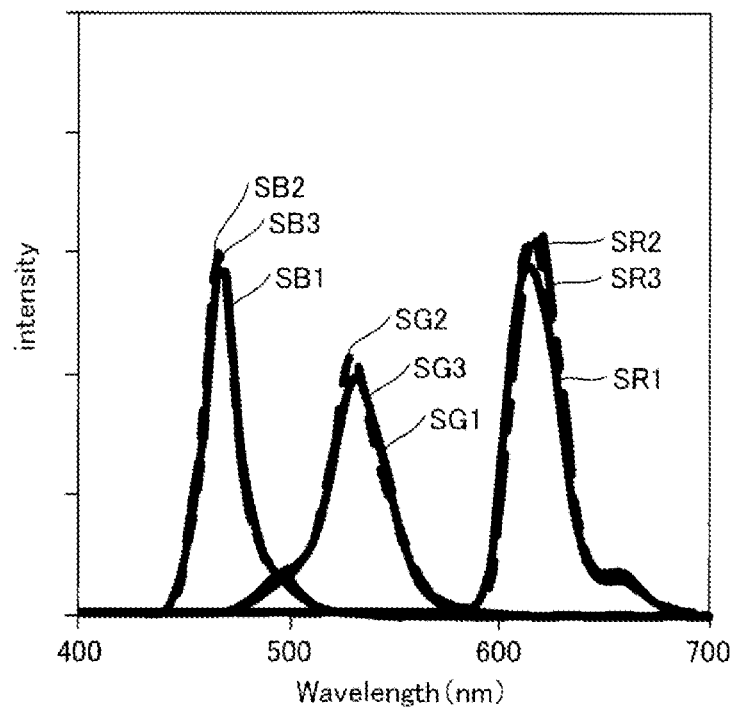
FIG. 4 is a diagram showing a spectrum of light transmitted through a protective layer illustrated in FIG. 1.
Figure 5:
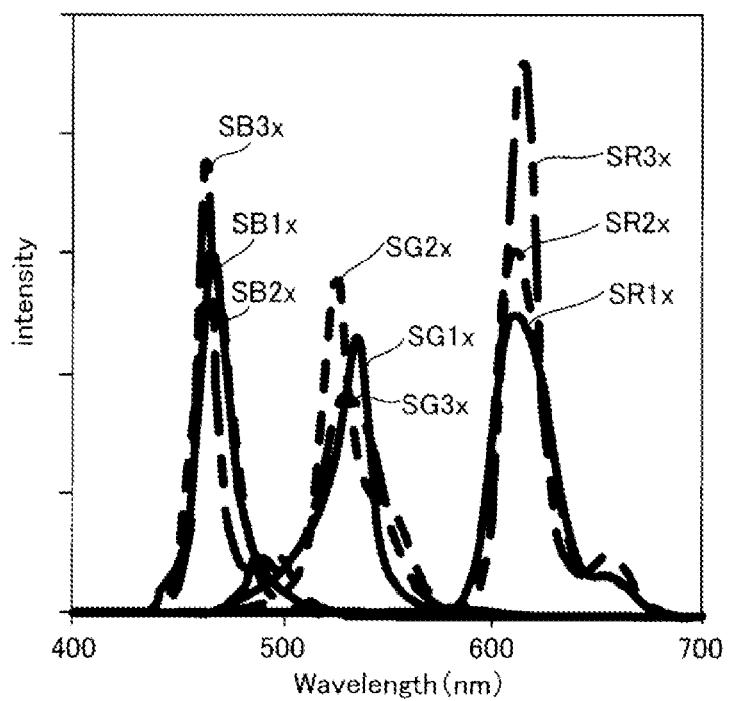
FIG. 5 is a spectrum of light transmitted through a protective layer included in an organic EL device of a reference example.

FIG. 4 is a diagram showing a spectrum of light transmitted through the protective layer 4 illustrated in FIG. 1. FIG. 5 is a spectrum of light transmitted through a protective layer included in an organic EL device of a reference example. Note that, the organic EL device of the reference example has a similar configuration to that of the organic EL device 100 except that a constituent material of a protective film is different. In the following, an element included in the organic EL device of the reference example is denoted by adding "x" at an end of a reference numeral.

FIG. 4 shows a spectrum of light emitted from each of the sub-pixels PB, PG, and PR. Each of spectra SB1, SB2, and SB3 indicates a spectrum of light emitted from the sub-pixel PB. Each of spectra SG1, SG2, and SG3 indicates a spectrum of light emitted from the sub-pixel PG. Each of spectra SR1, SR2, and SR3 indicates a spectrum of light emitted from the sub-pixel PR. Note that, the same applies to FIG. 5.

FIG. 4 shows spectra when the insulating films included in the protective layer 4 are formed of respective materials identical to each other. Specifically, FIG. 4 shows spectra when each of the first insulating film 41, the second insulating film 42, the third insulating film 43, the fourth insulating film 44, and the fifth insulating film 45 is formed of silicon nitride. In the example shown in FIG. 4, a refractive index in a visible light region of each of the first insulating film 41, the third insulating film 43, and the fifth insulating film 45 is 1.84, and a refractive index in a visible light region of each of the second insulating film 42 and the fourth insulating film 44 is 1.86. Thus, a refractive index difference between respective visible light regions of the low density film and the high density film is 0.02. Note that, depending on a film forming method, the refractive index varies with the same material.

FIG. 5 shows spectra when each of a first insulating film 41$x$, a third insulating film 43$x$, and a fifth insulating film 45$x$ included in a protective layer 4$x$ of the reference example is formed of silicon nitride, and each of a second insulating film 42$x$ and a fourth insulating film 44$x$ is formed of silicon oxide. In the example shown in FIG. 5, a refractive index of each of the first insulating film 41$x$, the third insulating film 43$x$, and the fifth insulating film 45$x$ is 1.84, and a refractive index of each of the second insulating film 42$x$ and the fourth insulating film 44$x$ is 1.52. Thus, a refractive index difference between a low density film and a density film is 0.32.

In addition, in FIG. 4, the spectra are shown when the thickness of each of the insulating films included in the protective layer 4 is changed. Each of the spectra SB1, SG1, and SR1 is a spectrum when the thickness of each of the insulating films of the protective layer 4 is a predetermined value. Each of the spectra SB2, SG2, and SR2 is a spectrum when the thickness of each of the insulating films is increased by 10% relative to the predetermined value. Each of the spectra SB3, SG3, and SR3 is a spectrum when the thickness of each of the insulating films is decreased by 10% relative to the predetermined value. Note that, the same applies to FIG. 5. Specifically, each of spectra SB1$x$, SG1$x$, and SR1$x$ is a spectrum when a thickness of each of the insulating films in the protective layer 4$x$ is a predetermined value. Each of spectra SB2$x$, SG2$x$, and SR2$x$ is a spectrum when the thickness of each of the insulating films is increased by 10% relative to the predetermined value. Each of spectra SB3$x$, SG3$x$, and SR3$x$ is a spectrum when the thickness of each of the insulating films is decreased by 10% relative to the predetermined value.

As illustrated in FIG. 4, when all the insulating films included in the protective layer 4 are formed of silicon nitride, even when the thickness of each of the insulating films included in the protective layer 4 is changed, a luminance of light does not easily change. Furthermore, a peak wavelength does not easily shift. Compared to this, in the case of the protective layer 4$x$ shown in FIG. 5, when the thickness of each of the insulating films included in the protective layer 4$x$ is changed, a luminance of light is easily changed. Furthermore, a peak wavelength is easily shifted. As can be seen from FIG. 4, all of the insulating films included in the protective layer 4 are formed of silicon nitride, thus even when a total film thickness of the protective layer 4 is changed, it is possible to suppress changes in the optical characteristics. Thus, even when the total film thickness of the protective layer 4 is increased to improve the sealing performance of the protective layer 4, it is possible to suppress the deterioration in the optical characteristics of the organic EL device 100.

In addition, each of the insulating films included in the protective layer 4 is formed of the inorganic material including silicon and nitrogen, thus, similar to the example illustrated in FIG. 4, even when the thickness of each of the insulating films included in the protective layer 4 is changed, the deterioration in the optical characteristics of the organic EL device 100 can be suppressed. Further, even when the number of insulating films included in the protective layer 4 is increased, the deterioration in the optical characteristics of the organic EL device 100 can be suppressed. Thus, the sealing performance of the protective layer 4 can be improved, and the deterioration in the optical characteristics of the organic EL device 100 can be suppressed.

Further, from another perspective, in order to enhance the sealing performance of the protective layer 4 and to suppress the deterioration in the optical characteristics of the organic EL device 100, in the present exemplary embodiment, a difference in refractive index among the plurality of insulating films included in the protective layer 4 is set. Specifically, a difference in refractive index in respective visible light regions between any two number of the insulating films of the first insulating film 41, the second insulating film 42, the third insulating film 43, the fourth insulating film 44, and the fifth insulating film 45 is within 0.2. Accordingly, the deterioration in the optical characteristics of the organic EL device 100 can be suppressed. In addition, when the difference in refractive index is within 0.2, even when the total film thickness of the protective layer 4 is changed, it is possible to suppress the deterioration in the optical characteristics. Thus, the total film thickness of the protective layer 4 can be increased to improve the sealing performance of the protective layer 4. In addition, when the difference in refractive index is within 0.2, even when the number of insulating films included in the protective layer 4 is increased, it is possible to suppress the deterioration in the optical characteristics of the organic EL device 100. Accordingly, a variation in luminance and color shift among the plurality of organic EL devices 100 can be suppressed.

Furthermore, in the present exemplary embodiment, the mutual refractive index differences among all the insulating films included in the protective layer 4 are within 0.2. Accordingly, interfacial reflection between the insulating films can be suppressed. Thus, the deterioration in the optical characteristics can be suppressed even when the total film thickness of the protective layer 4 is changed, and the effect of improving the sealing performance of the protective layer 4 can be particularly prominently exhibited. Furthermore, the mutual refractive index differences among all the insulating films included in the protective layer 4 may be within 0.1, and may be within 0.05. When the refractive index difference is within such a range, it is possible to particularly suppress the deterioration in the optical characteristics.

In addition, since all the insulating films included in the protective layer 4 are formed of the inorganic material including silicon and nitrogen, compared to a case where the insulating film is formed of an organic material, the protective layer 4 having a sufficiently small thickness can be realized. Further, since each of the insulating films is formed of the inorganic material, mechanical shock or the like applied to the light-emitting portion 2 from the outside can be mitigated. In addition, since the protective layer 4 is formed of the inorganic material, compared to the case where the protective layer 4 is formed of the organic material, it is possible to avoid a possibility that components of the protective layer 4 may penetrate into the function layer 24.

In addition, respective main materials of the first insulating film 41, the third insulating film 43, and the fifth insulating film 45 may be identical to each other, and respective main materials of the second insulating film 42 and the fourth insulating film 44 may be identical to each other. This makes it easy to set manufacturing conditions, and easy to form an insulating film having a target refractive index. Note that, the main material is a material that occupies 70% or more of constituent materials.

Furthermore, the respective main materials of the first insulating film 41, the second insulating film 42, the third insulating film 43, the fourth insulating film 44, and the fifth insulating film 45 may be identical to each other. When the main materials are identical to each other, compared to a case where the main materials are not identical to each other, the difference in refractive index among the plurality of insulating films can be reduced. Thus, while suppressing the deterioration in the optical characteristics of the organic EL device 100, the effect of improving the sealing performance of the protective layer 4 can be particularly prominently exhibited. Further, the variation in luminance and the color shift among the plurality of organic EL devices 100 can be particularly effectively suppressed.

The respective materials of the first insulating film 41, the second insulating film 42, the third insulating film 43, the fourth insulating film 44, and the fifth insulating film 45 may be silicon oxynitride or silicon nitride, for example. Since the main material is silicon nitride or silicon oxynitride, the sealing performance of the protective layer 4 can be particularly enhanced, and the deterioration in the optical characteristics of the organic EL device 100 can be particularly effectively suppressed. Furthermore, the gas barrier properties of the protective layer 4 can be improved, compared to a case where the main material is silicon oxide. Further, compared to a case where the protective layer 4 is mainly formed of alumina, water resistance can be improved.

Specifically, the respective main materials of all of the first insulating film 41, the second insulating film 42, the third insulating film 43, the fourth insulating film 44, and the fifth insulating film 45 may be silicon nitride. Accordingly, the protective layer 4 can exhibit particularly excellent sealing performance. Further, from another perspective, the respective main materials of all of the first insulating film 41, the second insulating film 42, the third insulating film 43, the fourth insulating film 44, and the fifth insulating film 45 may be silicon oxynitride. Since silicon oxynitride is used, compared to the case where silicon nitride is used, it is easier to form a film at a lower temperature, and stress applied to the protective layer 4 can be reduced. Furthermore, compared to the case where silicon nitride is used, optical transparency of the protective layer 4 can be improved.

The respective main materials of all of the first insulating film 41, the third insulating film 43, and the fifth insulating film 45 may be silicon nitride, and the respective main materials of all of the second insulating film 42 and the fourth insulating film 44 may be silicon oxynitride. The respective main materials of all of the first insulating film 41, the third insulating film 43, and the fifth insulating film 45 may be silicon oxynitride, and the respective main materials of all of the second insulating film 42 and the fourth insulating film 44 may be silicon nitride.

Additionally, the density of the first insulating film 41 illustrated in FIG. 3 may be lower than the density of each of the third insulating film 43 and the fifth insulating film 45. The first insulating film 41 of the protective layer 4 is closest to the light-emitting portion 2, and thus is most susceptible to the unevenness of the front surface of the light-emitting portion 2. Thus, by making the density of the first insulating film 41 lower than the density of each of the third insulating film 43 and the fifth insulating film 45, it is possible to mitigate unevenness of an upper surface of the first insulating film 41. Thus, the influence of the unevenness on the third insulating film 43 and the fifth insulating film 45 can be reduced. As a result, in the third insulating film 43 and the fifth insulating film 45, occurrence of defects caused by the unevenness, can be suppressed. On the other hand, each of the third insulating film 43 and the fifth insulating film 45 is closer to the outside than the first insulating film 41. Thus, by making the density of each of the third insulating film 43 and the fifth insulating film 45 higher, with respect to the density of the first insulating film 41, barrier properties of each of the third insulating film 43 and the fifth insulating film 45 can be enhanced. Thus, the plurality of organic EL elements 20 can be sufficiently protected from the outside.

Further, the thickness D1 of the first insulating film 41 is greater than each of the thickness D3 of the third insulating film 43 and the thickness D5 of the fifth insulating film 45. In other words, of the thicknesses D1, D3, and D5, the thickness D1 is the thickest. As described above, since the density of the first insulating film 41 is the lowest, stress is hardly applied to the first insulating film 41. Thus, even when the thickness D1 of the first insulating film 41 is increased, defects such as cracks and the like hardly occur in the first insulating film 41. Thus, the thickness D1 of the first insulating film 41 can be formed to be large. By increasing the thickness D1, the unevenness of the front surface of the light-emitting portion 2 can be sufficiently mitigated by the first insulating film 41. Thus, the influence of the unevenness on the third insulating film 43 and the fifth insulating film 45 can be more effectively reduced. As a result, in the third insulating film 43 and the fifth insulating film 45, occurrence of defects caused by the unevenness can be more effectively suppressed.

Figure 6:
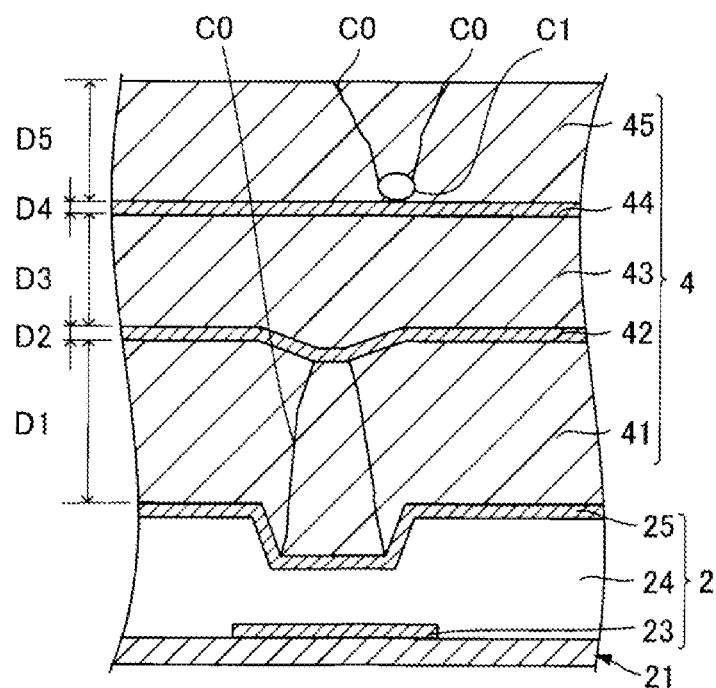
FIG. 6 is a cross-sectional view for explaining a function of the protective layer illustrated in FIG. 1.

FIG. 6 is a cross-sectional view for explaining the function of the protective layer 4 illustrated in FIG. 1. As illustrated in FIG. 6, by making the thickness D1 greater than each of the thickness D3 and the thickness D5, the upper surface of the first insulating film 41 can be brought close to be a flat surface. Thus, occurrence of a crack C0 in the third insulating film 43 is suppressed. Note that, as illustrated in FIG. 4, even when the crack C0 occurs in the first insulating film 41, since the unevenness of the upper surface of the light-emitting portion 2 is present, the second insulating film 42 is formed so as to cover the crack C0, thus the crack C0 is complemented. Thus, the crack C0 can be prevented from progressing to the third insulating film 43. Thus, the plurality of organic EL elements 20 can be sufficiently protected from the outside.

In addition, during film formation, for example, foreign substance C1 may be mixed into the fifth insulating film 45. Furthermore, the crack C0 may occur starting from the foreign substance C1. Due to the presence of the fourth insulating film 44, even when the crack C0 occurs, the crack C0 can be prevented from progressing to the third insulating film 43. Thus, it is possible to suppress transmission of moisture and the like in the atmosphere to the function layer 24 with the crack C0 being a path.

Figure 7:
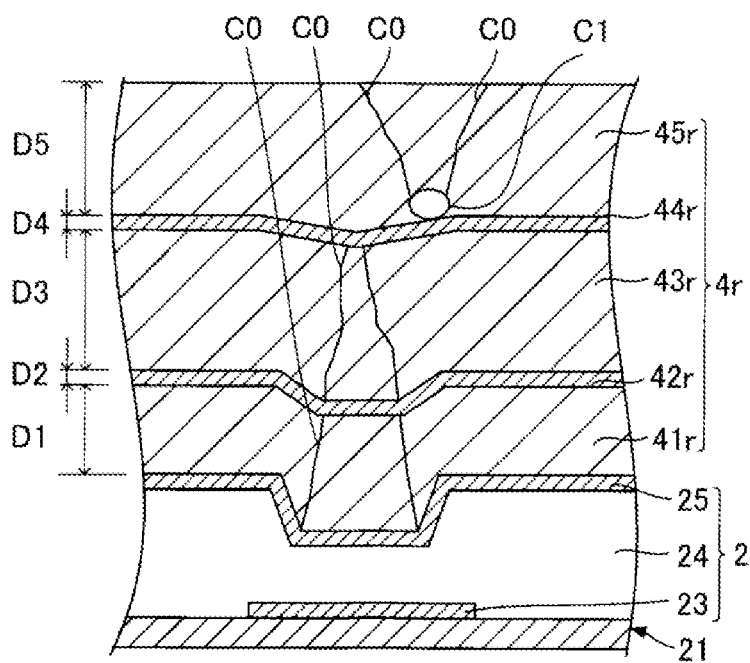
FIG. 7 is a diagram illustrating an example in which a thickness of a first insulating film included in the protective layer illustrated in FIG. 1 is changed.

FIG. 7 is a diagram illustrating an example in which the thickness D1 of the first insulating film 41 included in the protective layer 4 illustrated in FIG. 1 is changed. A protective layer 4r illustrated in FIG. 7 has a first insulating film 41r, a second insulating film 42r, a third insulating film 43r, a fourth insulating film 44r, and a fifth insulating film 45r. The protective layer 4r has a similar configuration to that of the protective layer 4 illustrated in FIG. 6 except that the thickness D1 is different.

As illustrated in FIG. 7, the thickness D1 of the first insulating film 41r may be smaller than each of the thickness D3 of the third insulating film 43r and the D5 of the fifth insulating film 45r. The thickness D1 of the first insulating film 41r illustrated in FIG. 7 is smaller than the thickness D1 of the first insulating film 41 illustrated in FIG. 6. In this case, unevenness of an upper surface of the first insulating film 41r is greater than the unevenness of the upper surface of the first insulating film 41. Thus, due to an effect of the unevenness of the first insulating film 41r, the crack C0 easily occurs in the third insulating film 43r, compared to the third insulating film 43. For example, by making density of the first insulating film 41r the lowest, even when the thickness D1 is smaller than each of the thicknesses D3 and D5, the unevenness of the upper surface of the first insulating film 41r can be mitigated. Furthermore, even when the crack C0 occurs in each of the first insulating film 41r and the third insulating film 43r, the second insulating film 42r and the fourth insulating film 44r are present, thus progress of the crack C0 can be prevented.

Additionally, the density of the third insulating film 43 illustrated in FIG. 3 may be less than or equal to the density of the fifth insulating film 45. The fifth insulating film 45 of the protective layer 4 is closest to the outside. Thus, by increasing the density of the fifth insulating film 45 to improve the barrier properties of the fifth insulating film 45, it is possible to more effectively exhibit a function of protecting the plurality of organic EL element 20 elements.

As illustrated in FIG. 3, in the present exemplary embodiment, the thickness D3 of the third insulating film 43 is equal to the thickness D5 of the fifth insulating film 45. Thus, the barrier properties of the fifth insulating film 45 can be improved, compared to a case where the thickness D5 is smaller than the thickness D3. Thus, the function of protecting the plurality of organic EL elements 20 elements from the outside can be more effectively exhibited. In addition, when the thickness D5 is greater than or equal to the thickness D3, the sealing performance of the protective layer 4 can be further enhanced.

The total film thickness of the protective layer 4 is not particularly limited, but may be greater than or equal to 500 nm and less than or equal to 2000 nm, may be greater than or equal to 600 nm and less than or equal to 1800 nm, and may be greater than or equal to 700 nm and less than or equal to 1500 nm. When the total film thickness is within such a range, the protective layer 4 having excellent sealing performance and a sufficiently small thickness can be achieved. Further, the deterioration in the optical characteristics can be sufficiently suppressed. In particular, since the organic EL device 100 is of the top-emission type, the total film thickness of the protective layer 4 is less than or equal to 1500 nm, thus the organic EL device 100 can be suitably used as a micro display, and the visual field angle characteristics can be improved. Note that, the total film thickness is an average thickness. Also, each of the thicknesses D1 to D5 is an average thickness.

The thickness D1 of the first insulating film 41 may be greater than or equal to 50 nm and less than or equal to 1000 nm, may be greater than or equal to 100 nm and less than or equal to 900 nm, and may be greater than or equal to 300 nm and less than or equal to 800 nm. When the thickness is within such a range, gas barrier properties of the first insulating film 41 can be particularly increased, and a possibility of cracking due to the thickness D1 of the first insulating film 41 becoming excessively thick can be reduced. Furthermore, the upper surface of the protective layer 4 can be sufficiently brought close to be a flat surface.

Each of the thickness D2 of the second insulating film 42 and the thickness D4 of the fourth insulating film 44 may be greater than or equal to 10 nm and less than or equal to 100 nm, may be greater than or equal to 15 nm and less than or equal to 90 nm, and may be greater than or equal to 20 nm and less than or equal to 80 nm. When the thickness D2 is within such a range, a function of complementing a defect in the first insulating film 41 can be significantly exhibited, and a formation time of the second insulating film 42 becoming excessively long can also be suppressed. In addition, when the thickness D4 is within such a range, a similar effect is exhibited.

Each of the thickness D3 of the third insulating film 43 and the thickness D5 of the fifth insulating film 45 may be greater than or equal to 200 nm and less than or equal to 1000 nm, may be greater than or equal to 250 nm and less than or equal to 800 nm, and may be greater than or equal to 200 nm and less than or equal to 600 nm. When the thickness D3 is within such a range, gas barrier properties of the third insulating film 43 can be particularly increased, and a possibility of cracking due to the thickness D3 of the third insulating film 43 becoming excessively thick can be reduced. In addition, when the thickness D5 is within such a range, a similar effect is exhibited.

Note that, other materials other than the above-described materials may be included in each of the insulating films included in the protective layer 4, to an extent that the function of each of the insulating films is not deteriorated. Further, the protective layer 4 is not limited to the configuration including the first insulating film 41, the second insulating film 42, the third insulating film 43, the fourth insulating film 44, and the fifth insulating film 45, and may further include other elements to an extent that the function of each of the insulating films is not deteriorated.

The color filter 6 illustrated in FIG. 3 selectively transmits light in a predetermined wavelength region. Color purity of light emitted from the organic EL device 100 can be increased by providing the color filter 6 as compared to a case where the color filter 6 is not provided. The color filter 6 is formed of a resin material such as an acrylic photosensitive resin material containing a color material, for example. The predetermined wavelength region for which light is selectively transmitted includes a peak wavelength λ0 determined by the optical distance L0.

The color filter 6 includes a colored portion 61B that transmits light in the blue wavelength region, a colored portion 61G that transmits light in the green wavelength region, and a colored portion 61R that transmits light in the red wavelength region. In addition, the colored portion 61B blocks light in the green wavelength region and light in the red wavelength region, the colored portion 61G blocks light in the blue wavelength region and light in the red wavelength region, and the colored portion 61R blocks light in the blue wavelength region and light in the green wavelength region. Also, although not illustrated, the colored portion 61B overlaps with the pixel electrode 23B corresponding thereto in plan view, the colored portion 61G overlaps with the pixel electrode 23G corresponding thereto in plan view, and the colored portion 61R overlaps with the pixel electrode 23R corresponding thereto in plan view. In addition, in the present exemplary embodiment, the colored portion 61B corresponds to a "first colored portion", the colored portion 61G corresponds to a "second colored portion", and the colored portion 61R corresponds to a "third colored portion".

The transmissive substrate 7 illustrated in FIG. 3 is a cover that protects the color filter 6, the organic EL element 20, and the like. The transmissive substrate 7 is transmissive and is formed of, for example, a glass substrate or a quartz substrate. Further, examples of a material of the adhesive layer 70 include transparent resin materials such as an epoxy resin and an acrylic resin. Note that, when the color filter 6 is omitted, the transmissive substrate 7 may directly adhere to the protective layer 4.

1A-2. Method for Manufacturing Organic EL Device 100

Figure 8:
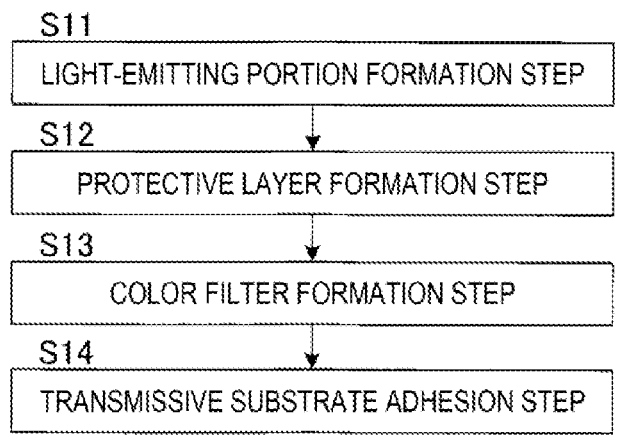
FIG. 8 is a flow of a method for manufacturing the organic EL device according to the first exemplary embodiment.

FIG. 8 is a flow of a method for manufacturing the organic EL device 100 according to the first exemplary embodiment. As illustrated in FIG. 8, the method for manufacturing the organic EL device 100 includes a light-emitting portion formation step S11, a protective layer formation step S12, a color filter formation step S13, and a transmissive substrate adhesion step S14.

In the light-emitting portion formation step S11, the substrate 10, the reflection layer 21, the insulating layer 22, and the plurality of organic EL elements 20 described above are formed. The substrate 10, the reflection layer 21, the insulating layer 22, and the plurality of organic EL elements 20 are manufactured by known techniques. Note that, the reflection layer 21 is formed by, for example, forming a metal film by a sputtering method or a vapor deposition method, and patterning the metal film by a photolithography method. The insulating layer 22 is formed by a CVD method and an etching method, for example. Further, for example, the plurality of pixel electrodes 23 are formed by a method similar to the method for forming the reflection layer 21 described above. Each layer included in the function layer 24 is formed by, for example, a vapor deposition method. Similar to the function layer 24, the common electrode 25 is formed by, for example, a vapor deposition method.

Figure 9:
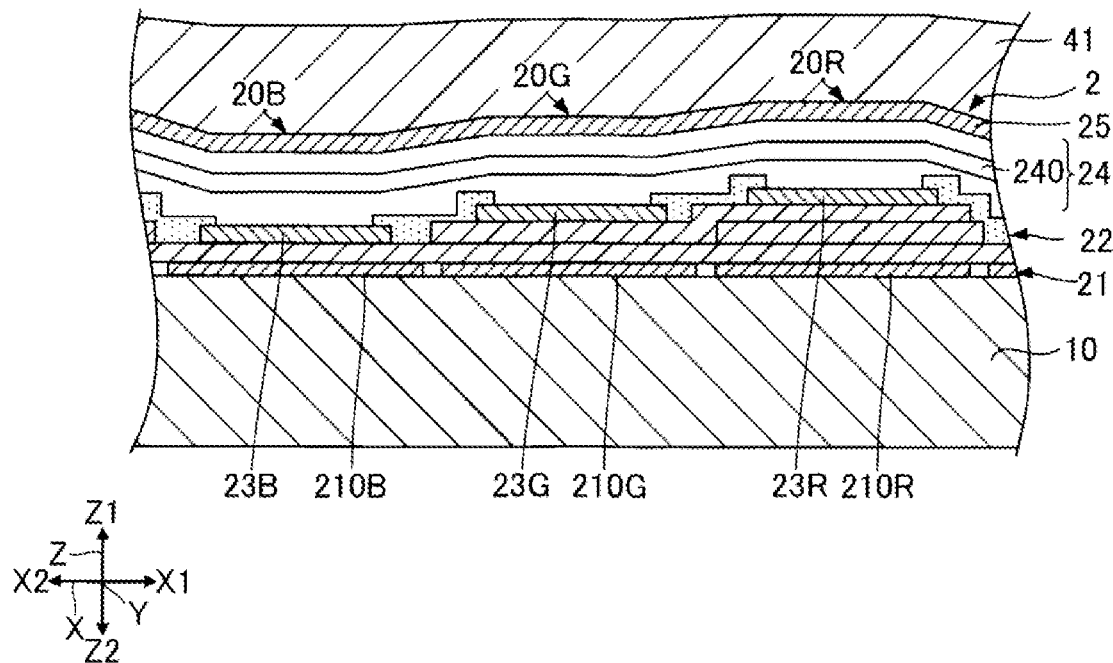
FIG. 9 is a diagram for explaining a protective layer formation step.
Figure 10:
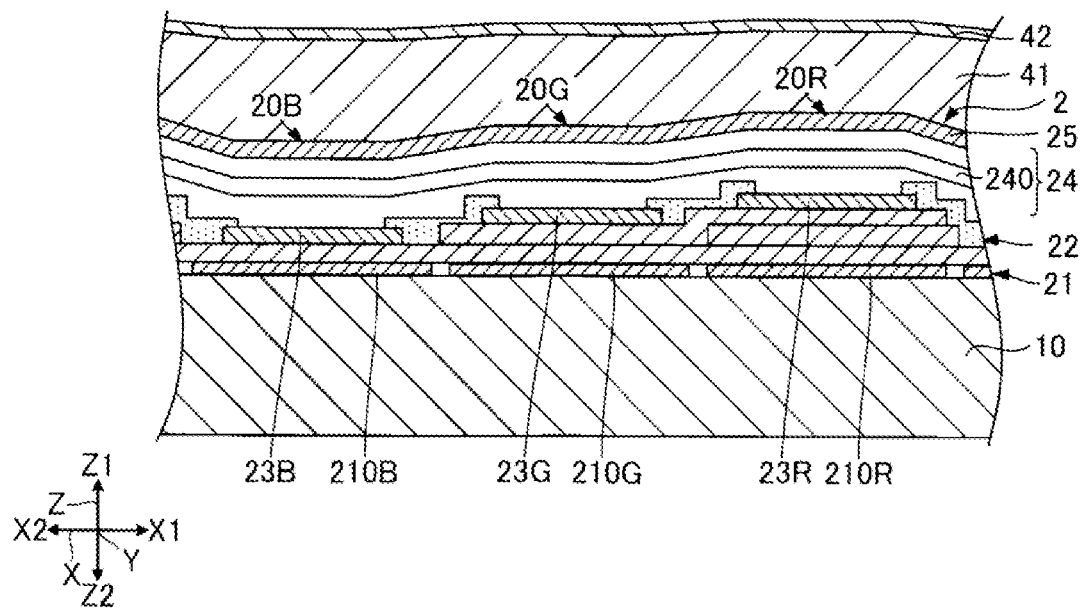
FIG. 10 is a diagram for explaining the protective layer formation step.
Figure 11:
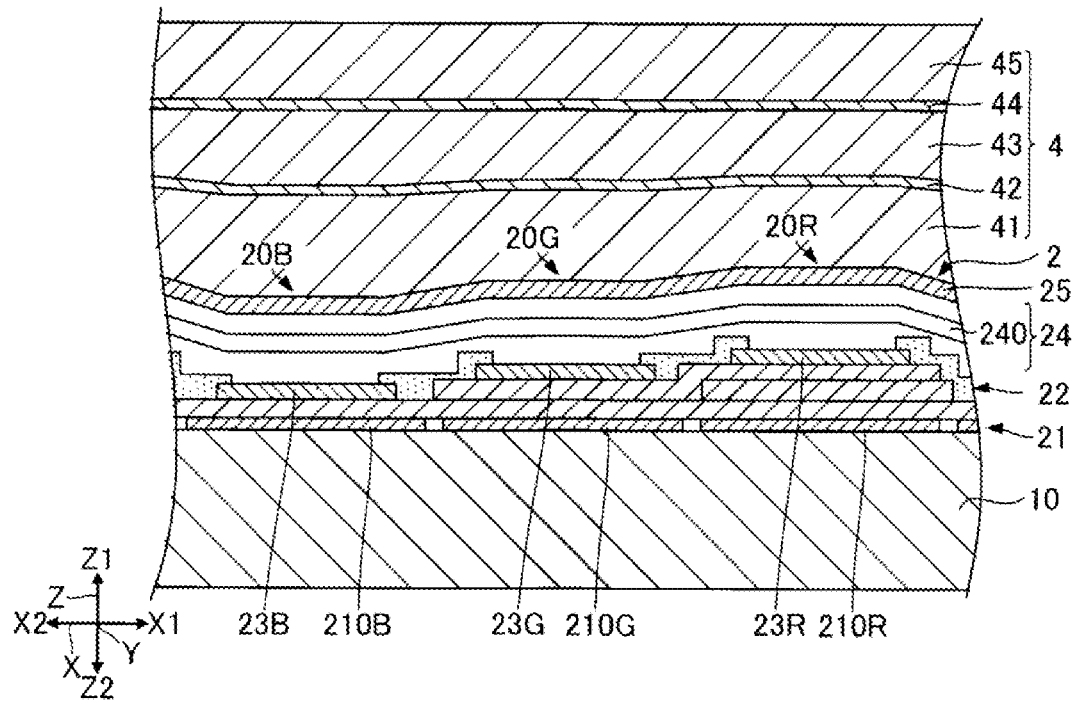
FIG. 11 is a diagram for explaining the protective layer formation step.

Each of FIGS. 9, 10, and 11 is a diagram for explaining the protective layer formation step S12. The protective layer formation step S12 includes a first insulating film formation step, a second insulating film formation step, a third insulating film formation step, a fourth insulating film formation step, and a fifth insulating film formation step.

Specifically, in the first insulating film formation step, as illustrated in FIG. 9, the first insulating film 41 is formed at the light-emitting portion 2 by a CVD method using plasma. Using the CVD method makes it easier to form a low density film compared to a case where an ALD method is used. Thus, the first insulating film 41 can mitigate the unevenness of the upper surface of the light-emitting portion 2. Additionally, a film formation speed can be increased by using the CVD method as compared to a case in which an ALD method is used, and thus film formation time of the first insulating film 41 can be shortened. Further, a film can be formed at a lower temperature by using plasma in the CVD method as compared to a case in which the plasma is not used. Thus, stress of the first insulating film 41 can be reduced.

Next, in the second insulating film formation step, as illustrated in FIG. 10, the second insulating film 42 is formed at the first insulating film 41 by an ALD method using plasma. Using the ALD method makes it easier to form a high density film compared to a case where a CVD method is used. Thus, even when a defect occurs in the first insulating film 41, the defect can be complemented by the second insulating film 42. Further, a film can be formed at a lower temperature by using plasma in the ALD method as compared to a case where the plasma is not used. Thus, stress of the second insulating film 42 can be reduced.

Next, the third insulating film formation step is performed with a similar method to that in the first insulating film formation step. Accordingly, the third insulating film 43 is formed at the second insulating film 42. Furthermore, by making film formation conditions of the third insulating film 43 different from film formation conditions of the first insulating film 41, the density of the third insulating film 43 can be set to be higher than the density of the first insulating film 41. Next, the fourth insulating film formation step is performed with a similar method to that in the second insulating film formation step. Thus, the fourth insulating film 44 is formed at the third insulating film 43. Next, the fifth insulating film formation step is performed with a similar method to that in the first insulating film formation step. Thus, the fifth insulating film 45 is formed at the fourth insulating film 44. Furthermore, by making film formation conditions of the fifth insulating film 45 different from the film formation conditions of the first insulating film 41, the density of the fifth insulating film 45 can be set to be higher than the density of the first insulating film 41. As described above, the protective layer 4 illustrated in FIG. 11 is obtained.

Note that, for example, after the fifth insulating film 45 is formed, a part of the protective layer 4 may be etched to expose the plurality of external terminals 104 illustrated in FIG. 1.

Since each of the insulating films included in the protective layer 4 is formed of the inorganic material including silicon and nitrogen, the etching can be performed efficiently and with high accuracy, compared to a case where the insulating film is formed of aluminum oxide. Furthermore, water resistance can be increased. Thus, even when an alkali developer solution is used in the color filter formation step S13 described below, a possibility of dissolution of the protective layer 4 can be suppressed. In addition, even when water washing treatment or the like is performed in each step, dissolution of the protective layer 4 is suppressed.

Figure 12:
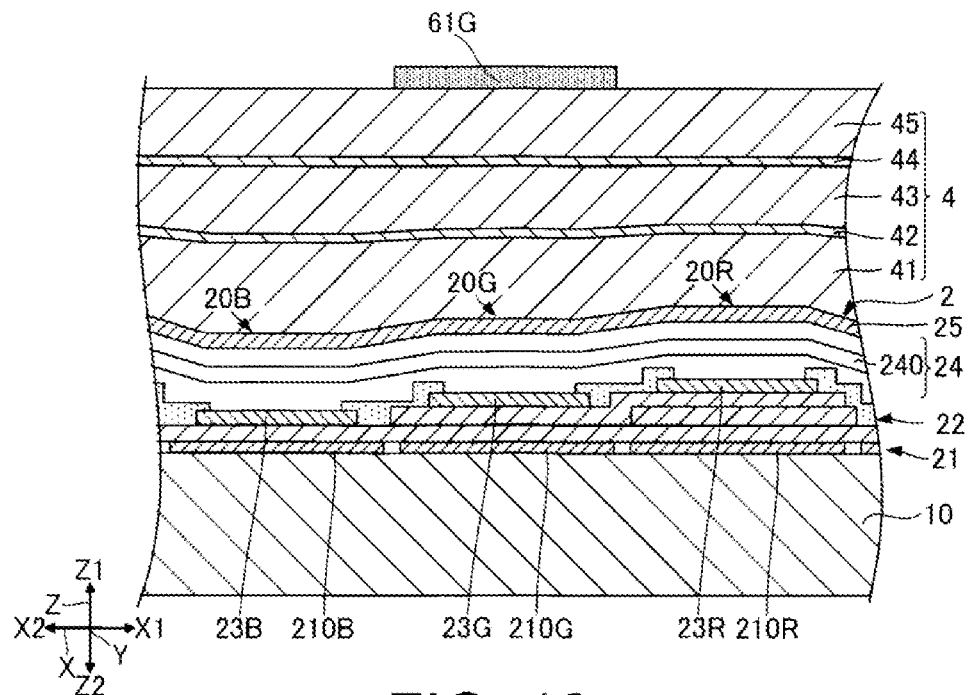
FIG. 12 is a diagram for explaining a color filter formation step.
Figure 13:
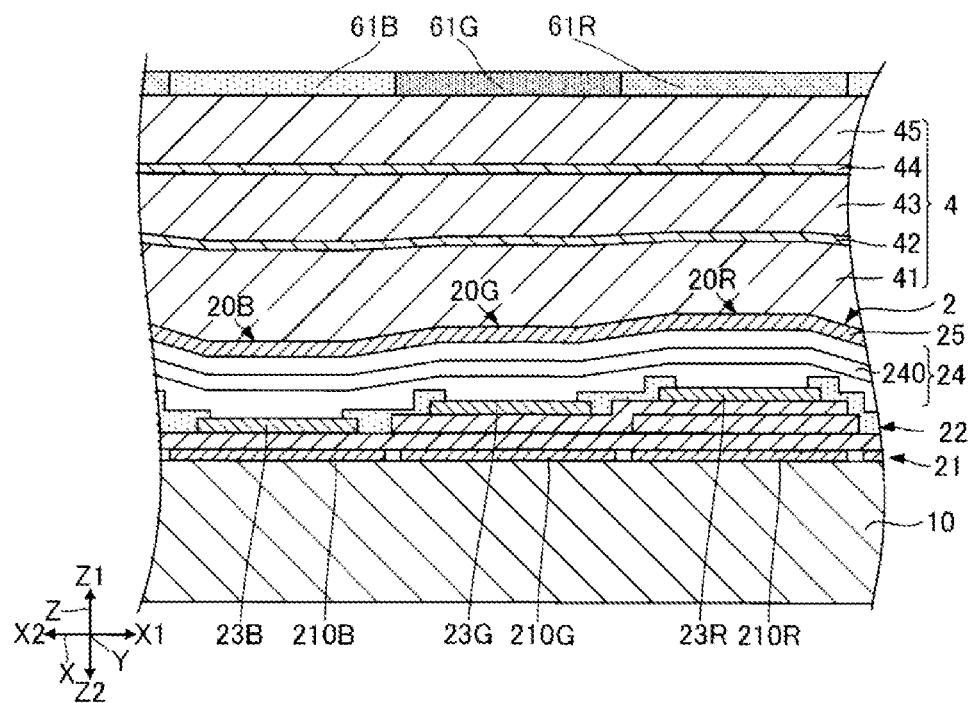
FIG. 13 is a diagram for explaining the color filter formation step.

FIGS. 12 and 13 are each a diagram illustrating the color filter formation step S13. First, as illustrated in FIG. 12, for example, the colored portion 61G is formed. For example, a green resin layer is formed by applying a photosensitive resin containing a green color material to the protective layer 4 by a spin coating method, and drying the photosensitive resin. Then, a portion of the green resin layer that forms the colored portion 61G is exposed, and an unexposed portion of the resin layer is removed by an alkaline developer or the like. Then, the colored portion 61G is formed by curing the green resin layer. Next, similarly to the formation of the colored portion 61G, the colored portion 61B is formed, and thereafter, the colored portion 61R is formed. As a result, as illustrated in FIG. 13, the color filter 6 is obtained.

Note that, a formation order of the colored portions 61G, 61B, and 61R is not limited to the above-described order. In addition, for example, after the color filter 6 is formed, a part of the protective layer 4 may be etched. In this case, the color filter 6 may be used as an etching mask.

In the transmissive substrate adhesion step S14, although not illustrated, a transparent resin material is applied onto the color filter 6, and subsequently, the transmissive substrate 7 formed of a glass substrate or the like is disposed on the applied resin material, and then pressed. At this time, for example, when the resin material is a photosensitive resin, the photosensitive resin is irradiated with light via the transmissive substrate 7. Accordingly, the photosensitive resin is cured. By the curing, the adhesive layer 70 formed of a cured product of the resin material is acquired. Further, the transmissive substrate 7 adheres to the color filter 6 by the adhesive layer 70.

Note that, the transmissive substrate 7 may be used as an etching mask to etch a part of the protective layer 4.

As described above, the organic EL device 100 is manufactured. According to the method described above, the organic EL device 100 can be easily and quickly formed. Furthermore, by appropriately using the ALD method and the CVD method, the protective layer 4 having excellent sealing performance can be formed easily and with high accuracy.

1B. Second Exemplary Embodiment

A second exemplary embodiment will be described. Note that, in each of the following illustrations, a reference numeral used in the description of the first exemplary embodiment is used for an element with a similar function to that of the first exemplary embodiment, and each detailed description thereof will be appropriately omitted.

Figure 14:
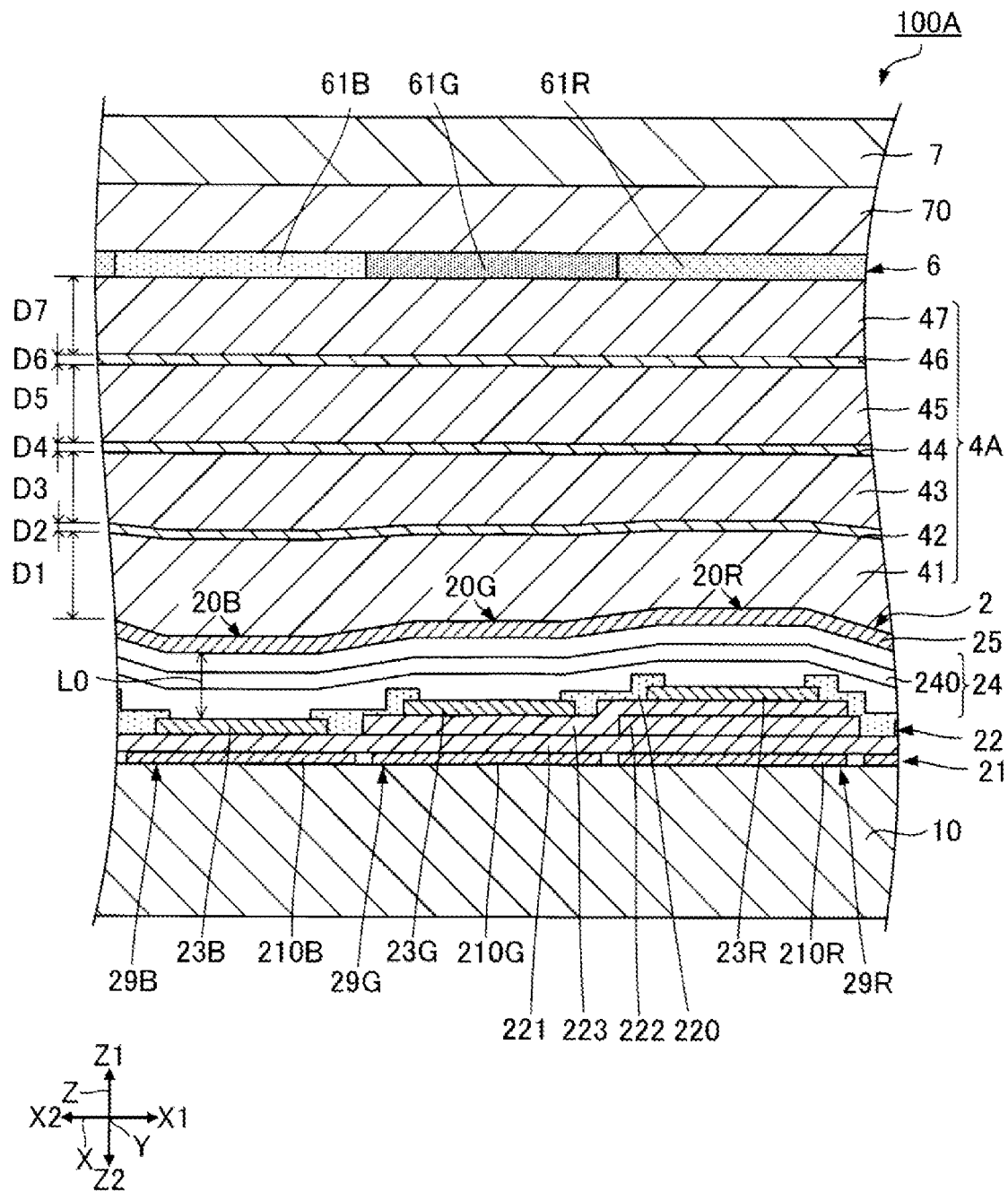
FIG. 14 is a cross-sectional view illustrating a part of an organic EL device according to a second exemplary embodiment.

FIG. 14 is a cross-sectional view illustrating a part of an organic EL device 100A according to the second exemplary embodiment. A protective layer 4A included in the organic EL device 100A illustrated in FIG. 14 has a sixth insulating film 46 and a seventh insulating film 47 in addition to the first insulating film 41, the second insulating film 42, the third insulating film 43, the fourth insulating film 44, and the fifth insulating film 45. The protective layer 4A is identical to the protective layer 4 of the first exemplary embodiment, except that the protective layer 4A further includes the sixth insulating film 46 and the seventh insulating film 47.

As illustrated in FIG. 14, the sixth insulating film 46 is disposed on the fifth insulating film 45. The sixth insulating film 46 is formed by, for example, a CVD method using plasma. The seventh insulating film 47 is disposed on the sixth insulating film 46. The seventh insulating film 47 is formed, for example, by an ALD method using plasma. The sixth insulating film 46 is a film similar to the fourth insulating film 44, and the seventh insulating film 47 is a film similar to the fifth insulating film 45. Thus, each of the sixth insulating film 46 and the seventh insulating film 47 is formed of the inorganic material including silicon and nitrogen. Furthermore, the sixth insulating film 46 complements defects that may occur in the fifth insulating film 45 and the seventh insulating film 47, and prevents progress of the defects. Furthermore, flatness of the protective layer 4A can be improved by having the seventh insulating film 47.

Density of the sixth insulating film 46 is equal to the density of the fourth insulating film 44, for example. Note that, the density of the sixth insulating film may be higher or lower than the density of the fourth insulating film 44. Further, density of the seventh insulating film 47 may be less than the density of the fifth insulating film 45, but may be greater than or equal to the density of the fifth insulating film 45. By increasing the density of the seventh insulating film 47 located in an outermost layer of the protective layer 4A, it is possible to more effectively exhibit the function of protecting the plurality of organic EL element 20 elements from the outside.

In addition, in the illustrated example, a thickness D6 of the sixth insulating film 46 is equal to the thickness D4 of the fourth insulating film 44, and a thickness D7 of the seventh insulating film 47 is equal to the thickness D5 of the fifth insulating film 45. Note that, the thickness D7 may be smaller or greater than the thickness D5. Similarly, the thickness D6 may be smaller or greater than the thickness D4.

A difference in refractive index in respective visible light regions between any two insulating films of all the insulating films of the protective layer 4A is within 0.2. Accordingly, the deterioration in the optical characteristics of the organic EL device 100A can be suppressed. Further, since the mutual difference in refractive index of all the insulating films included in the protective layer 4A is within 0.2, thus, deterioration in optical characteristics can be suppressed even when a total film thickness of the protective layer 4A is changed, and an effect of improving sealing performance of the protective layer 4A can be particularly prominently exhibited.

In addition, respective main materials of all the films included in the protective layer 4A may be identical to each other. When the main materials are identical to each other, compared to a case where the main materials are not identical to each other, the difference in refractive index among the plurality of insulating films can be reduced. Thus, while suppressing the deterioration in the optical characteristics of the organic EL device 100A, the effect of improving the sealing performance of the protective layer 4A can be particularly prominently exhibited.

Furthermore, the protective layer 4A has three sets of low density film and high density film. Thus, the sealing performance of the protective layer 4A can be improved compared to a case where the number of sets of the low density film and the high density film is two. Further, by increasing the number of sets, the sealing performance of the protective layer 4A can be improved. However, as the number of sets is increased, stress applied to the protective layer 4A is more likely to increase, and a crack and the like can easily be caused. Thus, the number of sets of the low density film and the high-density film may be greater than or equal to 1 and less than or equal to 3, and may be 2.

The protective layer 4A of the second exemplary embodiment described above can also exhibit excellent sealing performance, similar to the protective layer 4 of the first exemplary embodiment.

1C. Modified Example

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise. Furthermore, modification aspects of the first exemplary embodiment described below are appropriately applied to the second exemplary embodiment as far as the modification aspects do not conflict with each other.

In the first exemplary embodiment, the organic EL element 20 includes the light resonance structure in which a resonant wavelength is different for each color, but need not include the light resonance structure. Further, the light-emitting portion 2 may, for example, include a partition wall that partitions the function layer 24 for each organic EL element 20. Additionally, the organic EL element 20 may include a different light-emitting material for each of the sub-pixels P0. Further, the pixel electrode 23 may also have light reflectivity. In this case, the reflection layer 21 may be omitted. In addition, although the common electrode 25 is common in the plurality of organic EL elements 20, an individual cathode may be provided for each organic EL element 20. Also, in the first exemplary embodiment, the optical resonator 29 includes the organic EL element 20, but the "optical resonator" and the "organic EL element" need not include common elements.

In the first exemplary embodiment, the colored portions 61 of the color filter 6 are disposed in contact with each other, but a so-called black matrix may be interposed between the colored portions 61 of the color filter 6. For example, a black matrix may be disposed between the colored portions 61 to prevent color mixing between the colored portions 61 that are adjacent to each other.

Figure 15:
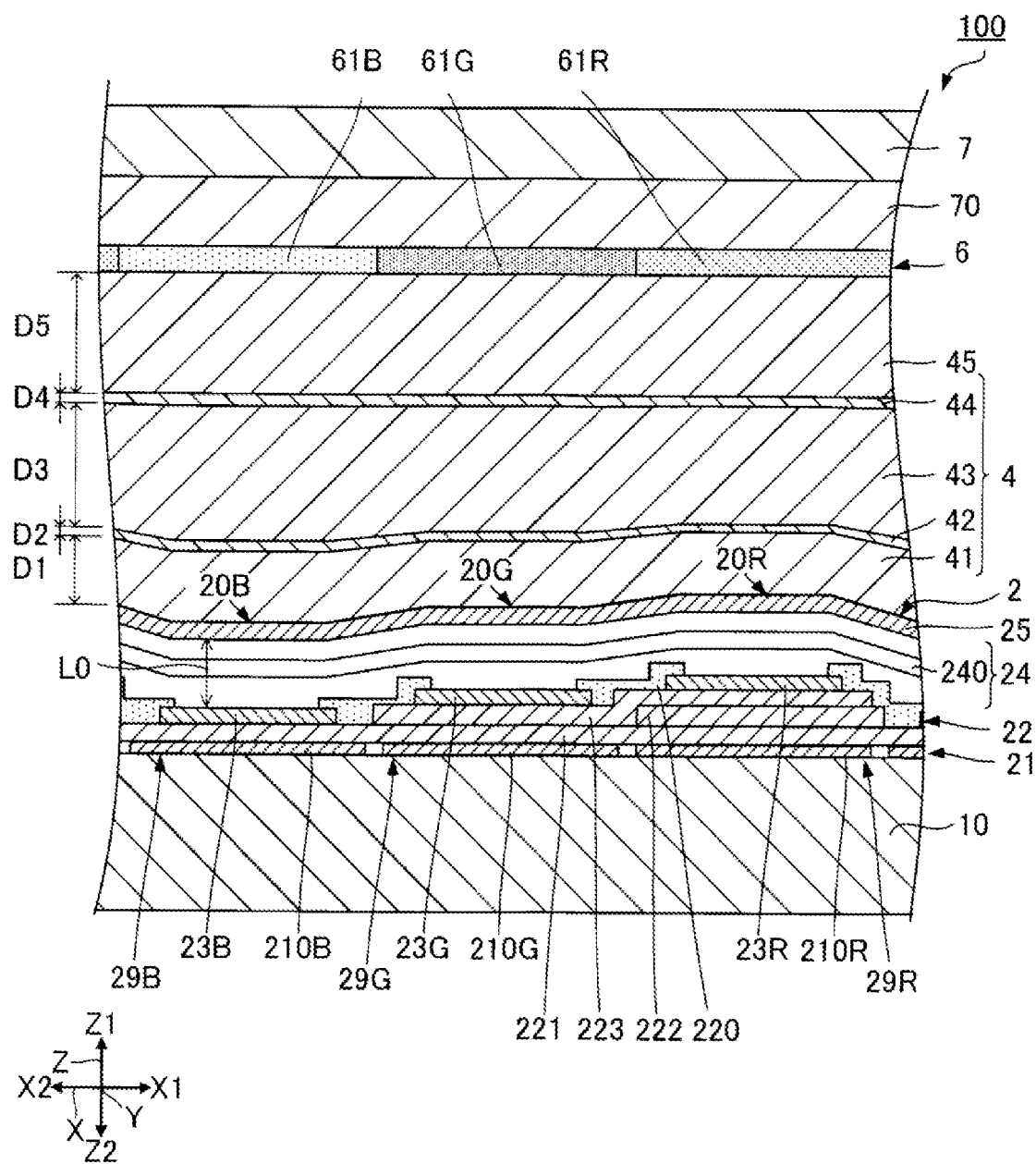
FIG. 15 is a cross-sectional view illustrating a part of an organic EL device according to a modified example.
Figure 16:
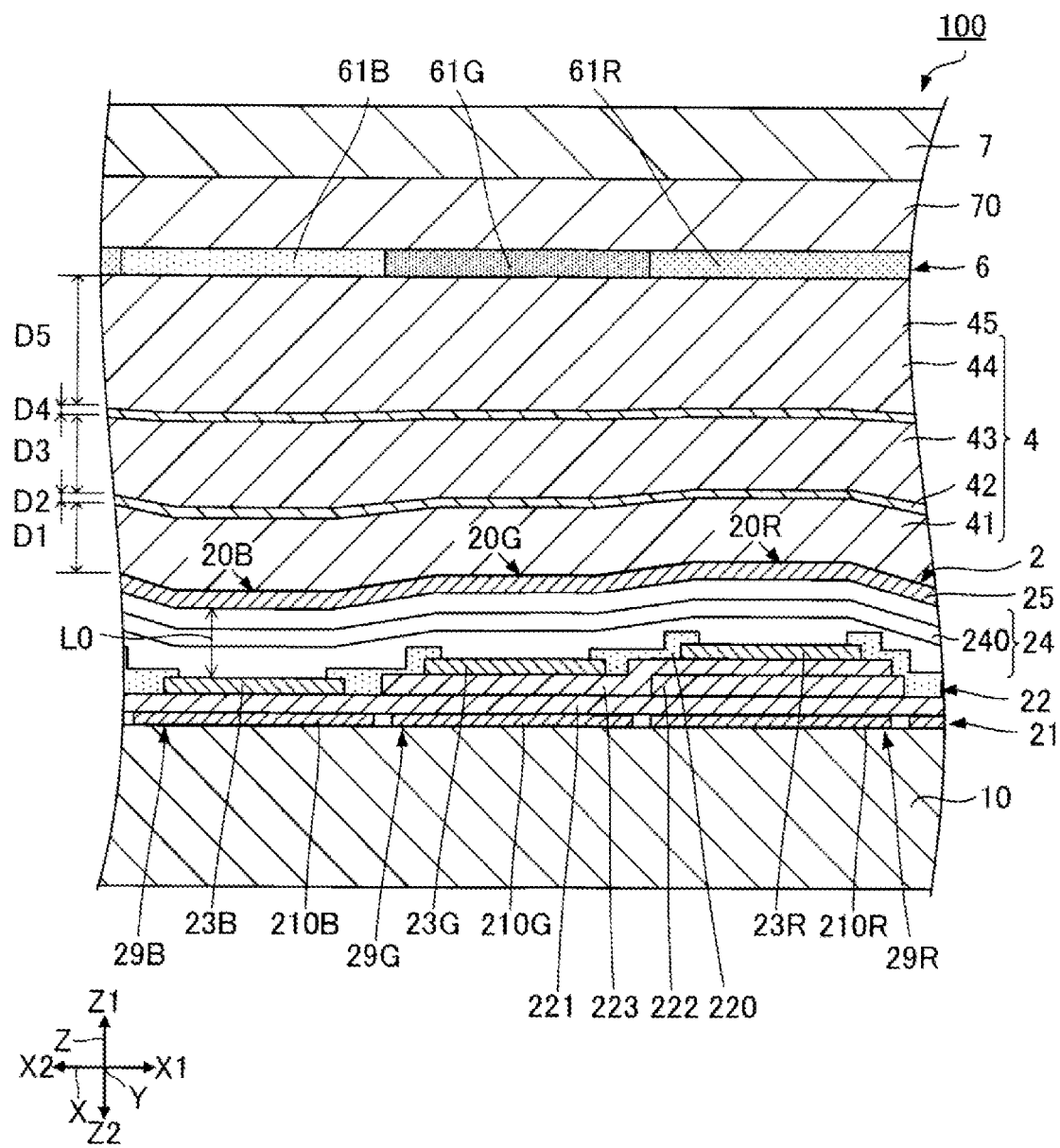
FIG. 16 is a cross-sectional view illustrating the part of the organic EL device according to the modified example.
Figure 17:
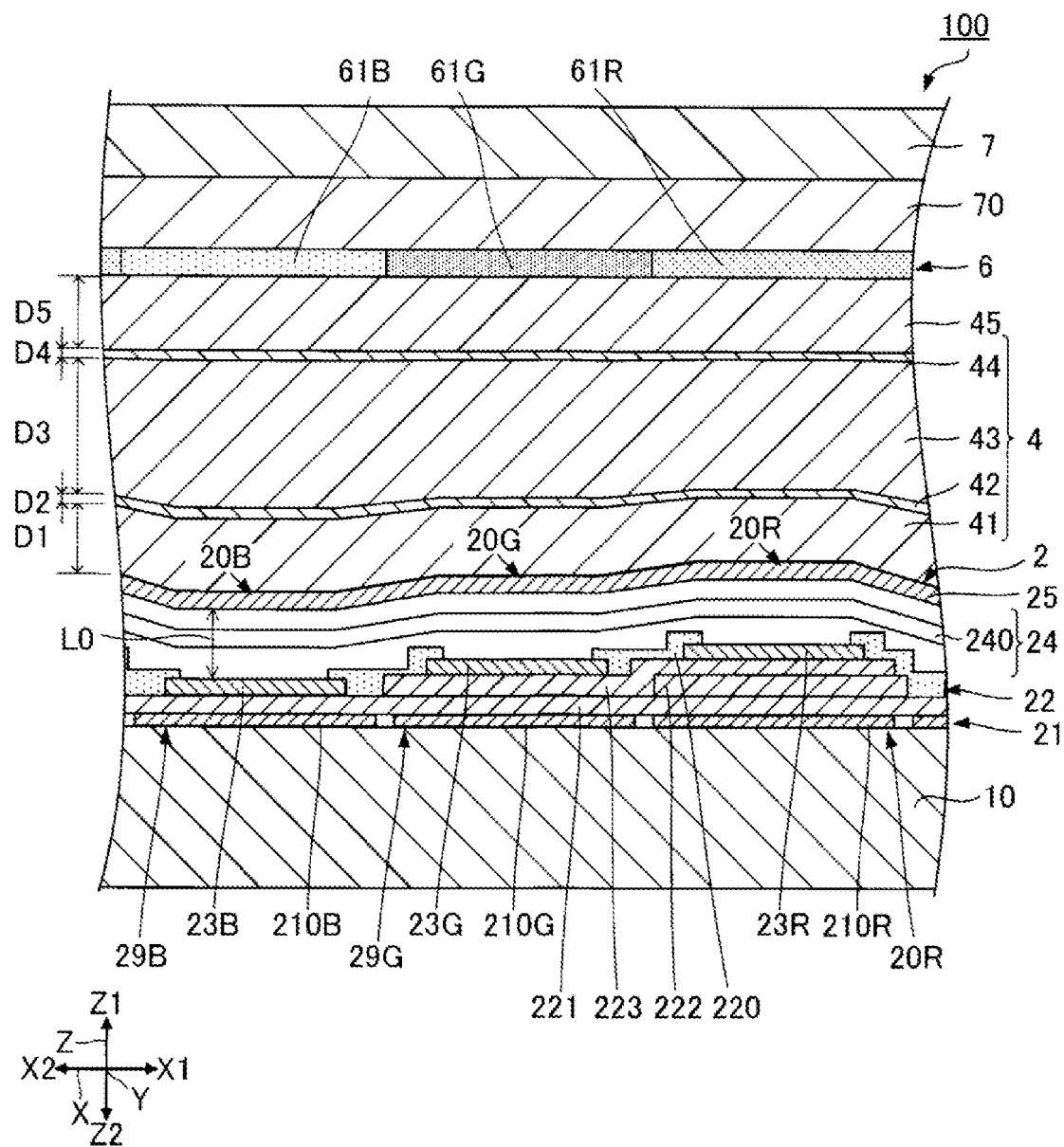
FIG. 17 is a cross-sectional view illustrating the part of the organic EL device according to the modified example.

In the first exemplary embodiment, each of the thickness D3 of the third insulating film 43 and the thickness D5 is smaller than the thickness D1 of the first insulating film 41, but the relationship among the thicknesses D1, D3, and D5 is not limited thereto. FIGS. 15, 16, and 17 are each a cross-sectional view illustrating apart of the organic EL device 100 in a modified example. As illustrated in FIG. 15, the thickness D1 may be smaller than each of thicknesses D3 and D5. In this case, the sealing performance of the protective layer 4 can be particularly improved. Also, as illustrated in FIG. 16, the thickness D5 may be greater than each of the thicknesses D1 and D3. Also, as illustrated in FIG. 17, the thickness D3 may be greater than each of the thicknesses D1 and D5. Further, although not illustrated, the thicknesses D1, D3, and D5 may be equal to each other. Additionally, the thicknesses D1, D3, and D5 may satisfy a relationship D1>D3>D5. Further, the thicknesses D1, D3, and D5 may satisfy a relationship D1<D3<D5.

In the first exemplary embodiment, the density of the third insulating film 43 is less than or equal to the density of the fifth insulating film 45, but may be higher than the density of the fifth insulating film 45.

Furthermore, the "organic EL device" is not limited to a device for displaying a full color image, but may be a device that displays an image only in a single color. For example, the "organic EL device" may be a device that displays an image expressed in green, or a device that displays an image expressed in orange.

2. Electronic Apparatus

The organic EL device 100 of the above-described exemplary embodiments is applicable to various electronic apparatuses.

2-1. Head-Mounted Display

Figure 18:
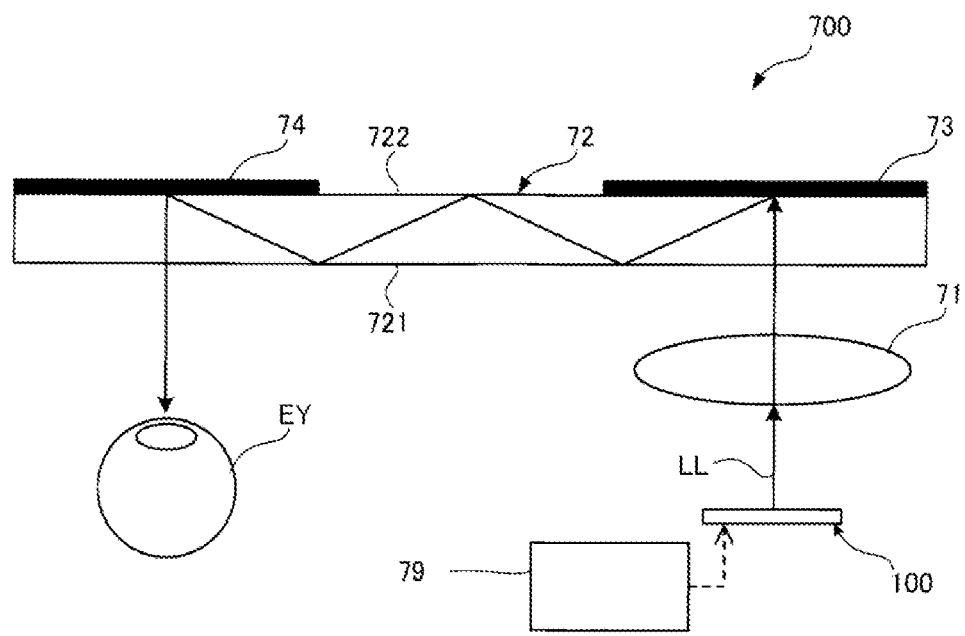
FIG. 18 is a plan view schematically illustrating a part of a virtual display apparatus as an example of an electronic apparatus.

FIG. 18 is a plan view schematically illustrating a part of a virtual display apparatus 700 as an example of an electronic apparatus. The virtual display apparatus 700 illustrated in FIG. 18 is a head-mounted display (HMD) mounted on a head of an observer and configured to display an image. The virtual display apparatus 700 includes the organic EL device 100 described above, a collimator 71, a light guide 72, a first reflection-type volume hologram 73, a second reflection-type volume hologram 74, and a control unit 79. Note that light emitted from the organic EL device 100 is emitted as image light LL. Furthermore, instead of the organic EL device 100, the organic EL device 100A may be used.

The control unit 79 includes, for example, a processor and a memory to control operation of the organic EL device 100. The collimator 71 is disposed between the organic EL device 100 and the light guide 72. The collimator 71 collimates light emitted from the organic EL device 100. The collimator 71 is constituted of a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light therein. A light incident port on which light is incident and a light emission port from which light is emitted are provided in a surface 721 of the light guide 72 facing the collimator 71. The first reflection-type volume hologram 73 as a diffractive optical element and the second reflection-type volume hologram 74 as a diffractive optical element are disposed on a surface 722 of the light guide 72 opposite to the surface 721. The second reflection-type volume hologram 74 is provided closer to the light emission port side than the first reflection-type volume hologram 73. The first reflection-type volume hologram 73 and the second reflection-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incident port travels while being repeatedly reflected, and is guided from the light emission port to an eye EY of the observer, and thus the observer can observe an image constituted of a virtual image formed by the image light LL.

Here, the virtual display apparatus 700 includes the above-described organic EL device 100. The above-described organic EL device 100 has excellent sealing performance and good quality. Thus, the virtual display apparatus 700 with high display quality can be provided by including the organic EL device 100.

Note that the virtual display apparatus 700 may include a synthetic element such as a dichroic prism configured to synthesize light emitted from the organic EL device 100. In this case, the virtual display apparatus 700 may include, for example, the organic EL device 100 configured to emit light in a blue wavelength region, the organic EL device 100 configured to emit light in a green wavelength region, and the organic EL device 100 configured to emit light in a red wavelength region.

2-2. Personal Computer

Figure 19:
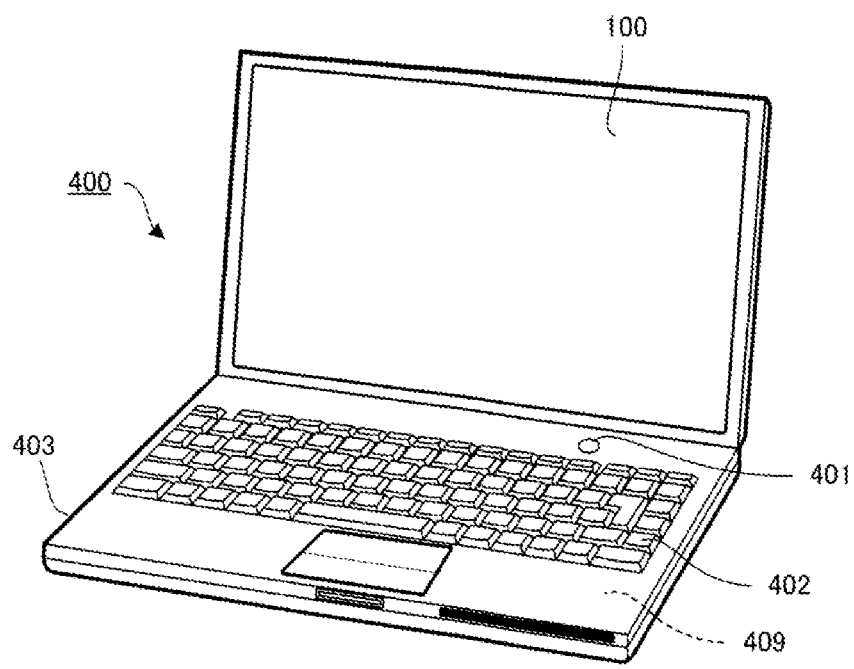
FIG. 19 is a perspective view illustrating a personal computer as an example of an electronic apparatus.

FIG. 19 is a perspective view illustrating a personal computer 400 as an example of the electronic apparatus in the present disclosure. The personal computer 400 illustrated in FIG. 19 includes the organic EL device 100, a main body 403 provided with a power switch 401 and a keyboard 402, and a control unit 409. The control unit 409 includes a processor and a memory, for example, to control operation of the organic EL device 100. The personal computer 400 includes the above-described organic EL device 100, and thus has excellent quality. Note that, the organic EL device 100A may be used instead of the organic EL device 100.

Note that examples of the "electronic apparatus" including the organic EL device 100 include, in addition to the virtual display apparatus 700 illustrated in FIG. 18 and the personal computer 400 illustrated in FIG. 19, an apparatus arranged close to eyes such as a digital scope, a digital binocular, a digital still camera, and a video camera. Further, the "electronic apparatus" including the organic EL device 100 is applied as a mobile phone, a smartphone, a Personal Digital Assistant (PDA), a car navigation device, and a vehicle-mounted display unit. Furthermore, the "electronic apparatus" including the organic EL device 100 is applied as illumination for illuminating light.

The present disclosure was described above based on the illustrated exemplary embodiments. However, the present disclosure is not limited thereto. In addition, the configuration of each component of the present disclosure may be replaced with any configuration that exerts the equivalent functions of the above-described exemplary embodiments, and to which any configuration may be added. Further, any configuration may be combined with each other in the above-described exemplary embodiments of the present disclosure.

What is claimed is:

1. An organic electroluminescence device, comprising:
   an organic electroluminescence element; and
   a protective layer that is configured to protect the organic electroluminescence element and has optical transparency, wherein
   the protective layer includes a first insulating film, a second insulating film, a third insulating film, a fourth insulating film, and a fifth insulating film,
   the first insulating film, the second insulating film, the third insulating film, the fourth insulating film, and the fifth insulating film are disposed in this order in a direction away from the organic electroluminescence element,
   a density of the second insulating film is higher than a density of the first insulating film, a density of the third insulating film, and a density of the fifth insulating film,
   a density of the fourth insulating film is higher than the density of the first insulating film, the density of the third insulating film, and the density of the fifth insulating film, and
   each of the first insulating film, the second insulating film, the third insulating film, the fourth insulating film, and the fifth insulating film includes an inorganic material including silicon and nitrogen.

2. The organic electroluminescence device according to claim 1, wherein
   of the first insulating film, the second insulating film, the third insulating film, the fourth insulating film, and the fifth insulating film, a difference in refractive index in visible light regions between any two insulating films is within 0.2.

3. The organic electroluminescence device according to claim 1, wherein
   a main material included in each of the first insulating film, the second insulating film, the third insulating film, the fourth insulating film, and the fifth insulating film is silicon nitride or silicon oxynitride.

4. The organic electroluminescence device according to claim 3, wherein
   main materials included respectively in the first insulating film, the third insulating film, and the fifth insulating film are identical to each other, and
   main materials included respectively in the second insulating film and the fourth insulating film are identical to each other.

5. The organic electroluminescence device according to claim 4, wherein
   main materials included respectively in the first insulating film, the second insulating film, the third insulating film, the fourth insulating film, and the fifth insulating film are identical to each other.

6. The organic electroluminescence device according to claim 1, wherein
a thickness of the second insulating film is smaller than a thickness of each of the first insulating film, the third insulating film, and the fifth insulating film, and
a thickness of the fourth insulating film is smaller than a thickness of each of the first insulating film, the third insulating film, and the fifth insulating film.

7. The organic electroluminescence device according to claim 1, wherein
the organic electroluminescence element further includes
a first organic electroluminescence element provided in a first pixel,
a second organic electroluminescence element provided in a second pixel,
a first optical resonator provided in the first pixel and having a resonant wavelength corresponding to a first wavelength region, and
a second optical resonator provided in the second pixel and having a resonant wavelength corresponding to a second wavelength region.

8. The organic electroluminescence device according to claim 7, further comprising:
a color filter, wherein
the color filter includes a first colored portion transmitting light in the first wavelength region, and a second colored portion transmitting light in the second wavelength region.

9. An electronic apparatus, comprising:
the organic electroluminescence device according to claim 1; and
a control unit configured to control operation of the organic electroluminescence device.

10. An organic electroluminescence device, comprising:
an organic electroluminescence element; and
a protective layer that is configured to protect the organic electroluminescence element and has optical transparency, wherein
the protective layer includes a first insulating film, a second insulating film, a third insulating film, a fourth insulating film, and a fifth insulating film,
the first insulating film, the second insulating film, the third insulating film, the fourth insulating film, and the fifth insulating film are disposed in this order in a direction away from the organic electroluminescence element,
a density of the second insulating film is higher than a density of the first insulating film, a density of the third insulating film, and a density of the fifth insulating film,
a density of the fourth insulating film is higher than the density of the first insulating film, the density of the third insulating film, and the density of the fifth insulating film, and
of the first insulating film, the second insulating film, the third insulating film, the fourth insulating film, and the fifth insulating film, a difference in refractive index in visible light regions between any two insulating films is within 0.2.

11. The organic electroluminescence device according to claim 10, wherein
a main material included in each of the first insulating film, the second insulating film, the third insulating film, the fourth insulating film, and the fifth insulating film is silicon nitride or silicon oxynitride.

12. The organic electroluminescence device according to claim 11, wherein
main materials included respectively in the first insulating film, the third insulating film, and the fifth insulating film are identical to each other, and
main materials included respectively in the second insulating film and the fourth insulating film are identical to each other.

13. The organic electroluminescence device according to claim 12, wherein
main materials included respectively in the first insulating film, the second insulating film, the third insulating film, the fourth insulating film, and the fifth insulating film are identical to each other.

14. An organic electroluminescence device, comprising:
a substrate;
a light emitting layer; and
a protective layer disposed on an opposite side of the light emitting layer from the substrate, wherein
the protective layer includes
a fifth insulating film,
a third insulating film disposed between the light emitting layer and the fifth insulating film,
a first insulating film disposed between the light emitting layer and the third insulating film,
a fourth insulating film disposed between the third insulating film and the fifth insulating film, and having a density higher than a density of each of the first insulating film, the third insulating film, and the fifth insulating film, and
a second insulating film disposed between the first insulating film and the third insulating film, and having a density higher than a density of each of the first insulating film, the third insulating film, and the fifth insulating film, and
each of the first insulating film, the second insulating film, the third insulating film, the fourth insulating film, and the fifth insulating film includes an inorganic material including silicon and nitrogen.

15. The organic electroluminescence device according to claim 14, wherein
of the first insulating film, the second insulating film, the third insulating film, the fourth insulating film, and the fifth insulating film, a difference in refractive index in visible light regions between two adjacent insulating films is within 0.2.

16. The organic electroluminescence device according to claim 14, wherein
a main material included in each of the first insulating film, the second insulating film, the third insulating film, the fourth insulating film, and the fifth insulating film is silicon nitride or silicon oxynitride.

17. The organic electroluminescence device according to claim 16, wherein
main materials included respectively in the first insulating film, the third insulating film, and the fifth insulating film are identical to each other, and
materials included respectively in the second insulating film and the fourth insulating film are identical to each other.

18. The organic electroluminescence device according to claim 17, wherein
main materials included respectively in the first insulating film, the second insulating film, the third insulating film, the fourth insulating film, and the fifth insulating film are identical to each other.

19. The organic electroluminescence device according to claim 14, wherein
  a thickness of the second insulating film is smaller than a thickness of each of the first insulating film, the third insulating film, and the fifth insulating film, and
  a thickness of the fourth insulating film is smaller than a thickness of each of the first insulating film, the third insulating film, and the fifth insulating film.

\* \* \* \* \*